US011482380B2

(12) United States Patent
Yokomizo

(10) Patent No.: US 11,482,380 B2
(45) Date of Patent: Oct. 25, 2022

(54) MULTILAYER CERAMIC CAPACITOR

(71) Applicant: Murata Manufacturing Co., Ltd., Nagaokakyo (JP)

(72) Inventor: Satoshi Yokomizo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/149,924

(22) Filed: Jan. 15, 2021

(65) Prior Publication Data
US 2021/0335547 A1 Oct. 28, 2021

(30) Foreign Application Priority Data
Apr. 24, 2020 (JP) .............................. JP2020-077300

(51) Int. Cl.
*H01G 4/30* (2006.01)
*C04B 35/468* (2006.01)
*H01G 4/008* (2006.01)
*H01G 4/12* (2006.01)

(52) U.S. Cl.
CPC ........... *H01G 4/30* (2013.01); *C04B 35/4682* (2013.01); *H01G 4/0085* (2013.01); *H01G 4/1227* (2013.01)

(58) Field of Classification Search
None
See application file for complete search history.

(56) References Cited

U.S. PATENT DOCUMENTS

| 9,042,114 B2* | 5/2015 | Hattori | H05K 1/181 361/767 |
| 9,082,549 B2* | 7/2015 | Hattori | H01G 2/06 |
| 9,082,550 B2* | 7/2015 | Hattori | H01G 2/065 |
| 9,686,855 B2* | 6/2017 | Ishikawa | H05K 1/113 |
| 2003/0117784 A1* | 6/2003 | Fukunabe | H05K 3/3442 361/760 |
| 2011/0127680 A1* | 6/2011 | Masuda | H01L 23/49816 257/E21.477 |
| 2014/0016242 A1* | 1/2014 | Hattori | H05K 1/181 361/303 |

(Continued)

FOREIGN PATENT DOCUMENTS

| CN | 104995703 A | 10/2015 |
| JP | 2015-023209 A | 2/2015 |

OTHER PUBLICATIONS

Office Action in CN202110100257.4, dated Jul. 4, 2022, 8 pages.

*Primary Examiner* — Dion R. Ferguson
(74) *Attorney, Agent, or Firm* — Keating & Bennett, LLP

(57) ABSTRACT

An interposer of a multilayer ceramic capacitor includes a first through-hole in which a first pass-through conductive portion is provided on an inside wall thereof. A first surface side of the first through-hole is filled with a first conductive joining material that recessed at a central portion thereof as the first through-hole is seen from a second surface toward a first surface. The interposer includes a second through-hole in which a second pass-through conductive portion is provided on an inside wall thereof. A first surface side of the second through-hole is filled with a second conductive joining material that is recessed at a central portion thereof as the second through-hole is seen from a second surface toward a first surface.

20 Claims, 16 Drawing Sheets

(56) References Cited

U.S. PATENT DOCUMENTS

| | | | |
|---|---|---|---|
| 2014/0041914 A1* | 2/2014 | Hattori | H01G 4/232 |
| | | | 174/260 |
| 2014/0116768 A1* | 5/2014 | Hattori | H01G 4/228 |
| | | | 174/260 |
| 2014/0124256 A1* | 5/2014 | Hattori | H05K 1/181 |
| | | | 174/260 |
| 2016/0007446 A1* | 1/2016 | Ishikawa | H05K 1/181 |
| | | | 361/301.4 |
| 2020/0111616 A1* | 4/2020 | Choi | C04B 35/62815 |
| 2020/0118743 A1* | 4/2020 | Byun | H01G 4/12 |
| 2020/0343044 A1* | 10/2020 | Bae | H01G 4/228 |
| 2021/0335543 A1* | 10/2021 | Yokomizo | H01G 2/02 |
| 2021/0335544 A1* | 10/2021 | Yokomizo | H01G 4/008 |
| 2021/0335547 A1* | 10/2021 | Yokomizo | H01G 4/232 |
| 2021/0337669 A1* | 10/2021 | Yokomizo | H01G 4/232 |
| 2021/0337670 A1* | 10/2021 | Yokomizo | H01G 4/232 |

\* cited by examiner

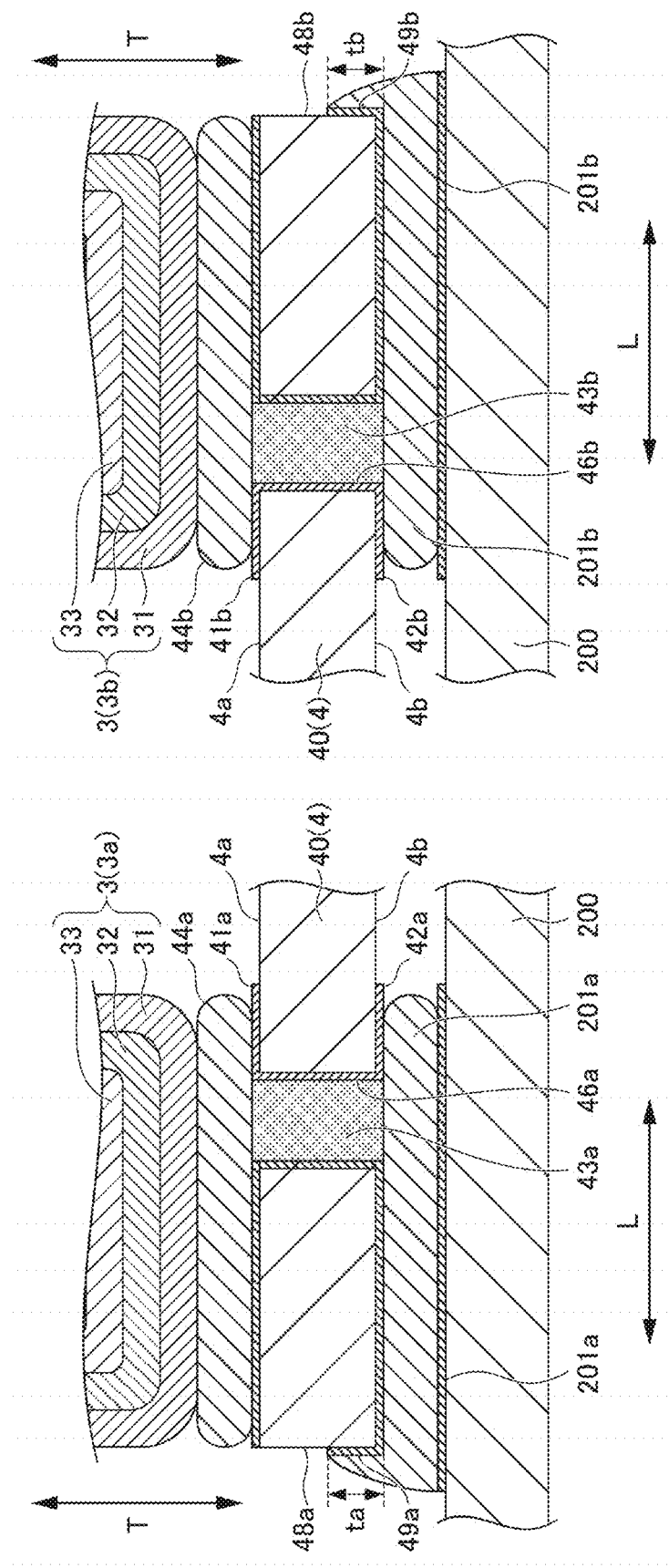

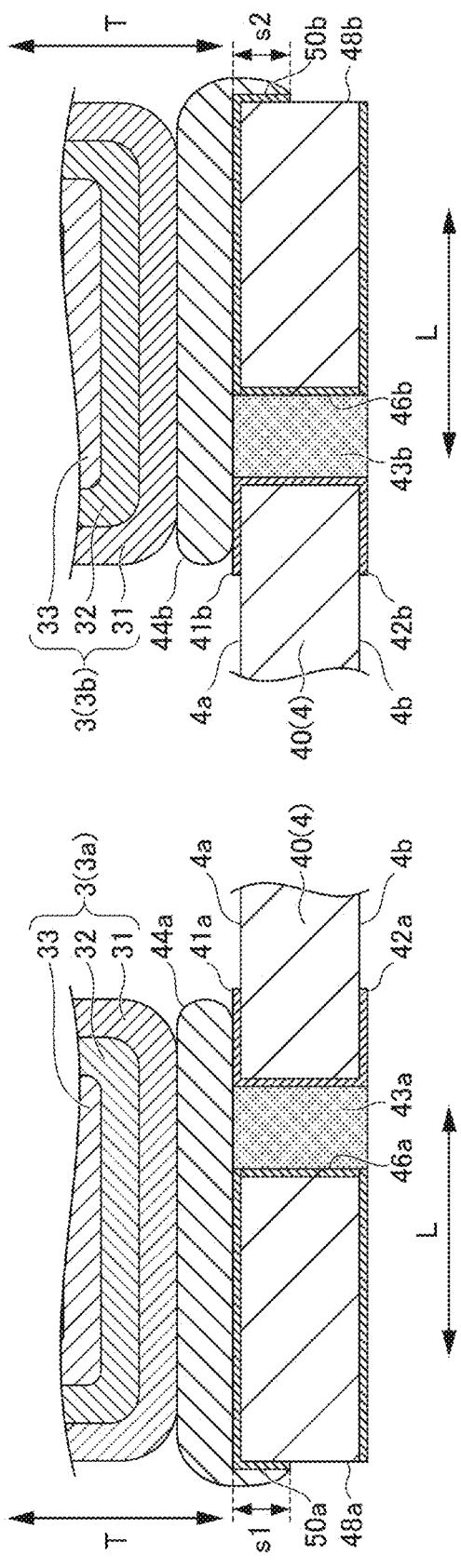

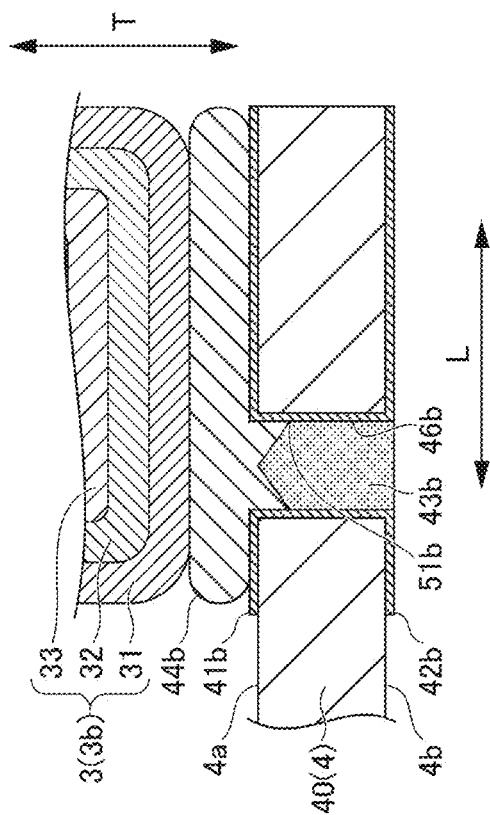
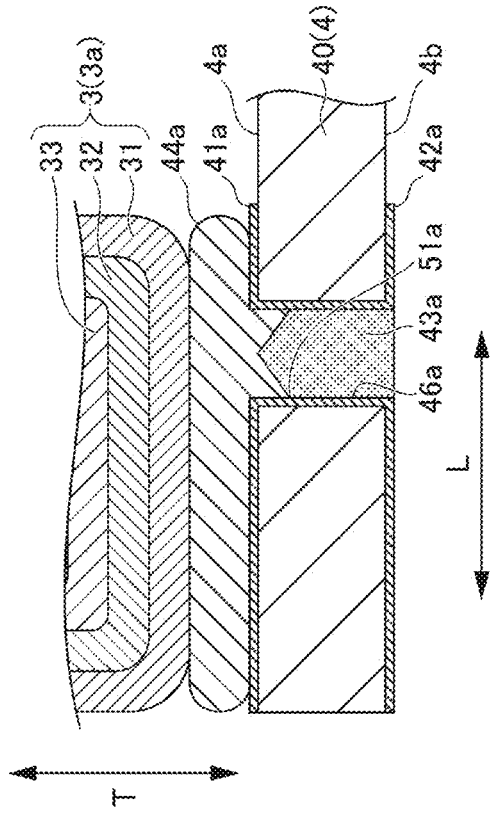

MULTILAYER CERAMIC CAPACITOR

CROSS REFERENCE TO RELATED APPLICATIONS

This application claims the benefit of priority to Japanese Patent Application No. 2020-077300 filed on Apr. 24, 2020. The entire contents of this application are hereby incorporated herein by reference.

BACKGROUND OF THE INVENTION

1. Field of the Invention

The present invention relates to multilayer ceramic capacitors.

2. Description of the Related Art

In recent years, large-capacitance, small-sized multilayer ceramic capacitors have been required. Such a multilayer ceramic capacitor includes an inner layer portion in which dielectric layers made of a ferroelectric material having a relatively high relatively dielectric constant and internal electrodes are alternately layered. A dielectric layer is disposed on each of the upper portion and the lower portion of the inner layer portion to form a stack body having a rectangular parallelepiped shape, and a side gap portion is provided on each of the opposite lateral surfaces of the stack body in a width direction to form a stack, and external electrodes are provided on the opposite end surfaces of the stack in a longitudinal direction to form a capacitor body.

Another known multilayer ceramic capacitor includes an interposer disposed on a side on which a substrate is mounted in a capacitor body in order to prevent or reduce the occurrence of "acoustic noise".

Some interposers have a through-hole passing through in a stacking direction for conduction between an external electrode and a mounting board. Joining solder is used to join a capacitor body and the interposer to each other, and if the joining solder enters the through-hole during joining, the through-hole is filled with the joining solder.

Also in mounting of a multilayer ceramic capacitor on a substrate, mounting solder is used. If the through-hole is filled with the joining solder in mounting, the mounting solder fails to enter the through-hole, leading to an unstable position of the multilayer ceramic capacitor in mounting.

Considering the above, in one conventional technique, a through-hole is covered with a solder-free film to provide a space which is not filled with the joining solder in the through-hole, thereby securing room for inflow of joining solder (see Japanese Patent Laid-Open No. 2015-23209).

The above technique, however, requires an additional step of covering the through-hole with the solder-free film.

SUMMARY OF THE INVENTION

Preferred embodiments of the present invention provide multilayer ceramic capacitors that each enable easier formation of a space in a lower portion of a through-hole of an interposer for a stable position of the multilayer ceramic capacitor in mounting.

A multilayer ceramic capacitor according to a preferred embodiment of the present invention includes a capacitor body and an interposer. The capacitor body includes a stack including dielectric layers and internal electrode layers alternately stacked, a first main surface on one side in a stacking direction and a second main surface on the other side in the stacking direction, and a first end surface on one side in a length direction intersecting the stacking direction and a second end surface on the other side in the length direction; a first external electrode disposed on the first end surface of the stack and extending from the first end surface to a portion of the first main surface and a portion of the second main surface; and a second external electrode disposed on the second end surface of the stack and extending from the second end surface to a portion of the first main surface and a portion of the second main surface. The interposer is disposed on a second main surface side in the capacitor body, and includes a first surface facing the second main surface and a second surface opposite to the first surface. The interposer includes, on a first external electrode side in the length direction, a first joining electrode on a first surface side, a first mounting electrode on a second surface side, and a first through-hole passing through the interposer in the stacking direction and in which a first pass-through conductive portion is provided on an inside wall of the first through-hole, the first pass-through conductive portion making the first joining electrode and the first mounting electrode conductive. A first surface side of the first through-hole is filled with a first conductive joining material, and the first conductive joining material is recessed at a central portion thereof as the first through-hole is seen from the second surface toward the first surface. The interposer includes, on a second external electrode side in the length direction, a second joining electrode on the first surface side, a second mounting electrode on the second surface side, and a second through-hole passing through the interposer in the stacking direction and in which a second pass-through conductive portion is provided on an inside wall of the second through-hole, the second pass-through conductive portion making the second joining electrode and the second mounting electrode conductive. A first surface side of the second through-hole is filled with a second conductive joining material, and the second conductive joining material is recessed at a central portion thereof as the second through-hole is seen from the second surface toward the first surface.

Preferred embodiments of the present invention provide multilayer ceramic capacitors that each enable easier formation of a space in a lower portion of a through-hole of an interposer for a stable position of the multilayer ceramic capacitor in mounting.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 14A is a partially enlarged view of a multilayer ceramic capacitor according to Preferred Embodiment 3 of the present invention on one side in a length direction, which is mounted on a substrate.

FIG. 14B is a partially enlarged view of the multilayer ceramic capacitor on the other side in the length direction in Preferred Embodiment 3 of the present invention, which is mounted on the substrate.

FIG. 15A is a partially enlarged view of a multilayer ceramic capacitor according to Preferred Embodiment 4 of the present invention on one side in a length direction.

FIG. 15B is a partially enlarged view of the multilayer ceramic capacitor on the other side in the length direction in Preferred Embodiment 4 of the present invention.

FIG. 16A is a partially enlarged view of a multilayer ceramic capacitor according to Preferred Embodiment 5 of the present invention on one side in a length direction.

FIG. 16B is a partially enlarged view of the multilayer ceramic capacitor on the other side in the length direction in Preferred Embodiment 5 of the present invention.

DETAILED DESCRIPTION OF THE PREFERRED EMBODIMENTS

Preferred embodiments of the present invention will be described in detail below with reference to the drawings.

Preferred Embodiment 1

A multilayer ceramic capacitor 1 according to Preferred Embodiment 1 of the present invention will now be described.

Figure 1:
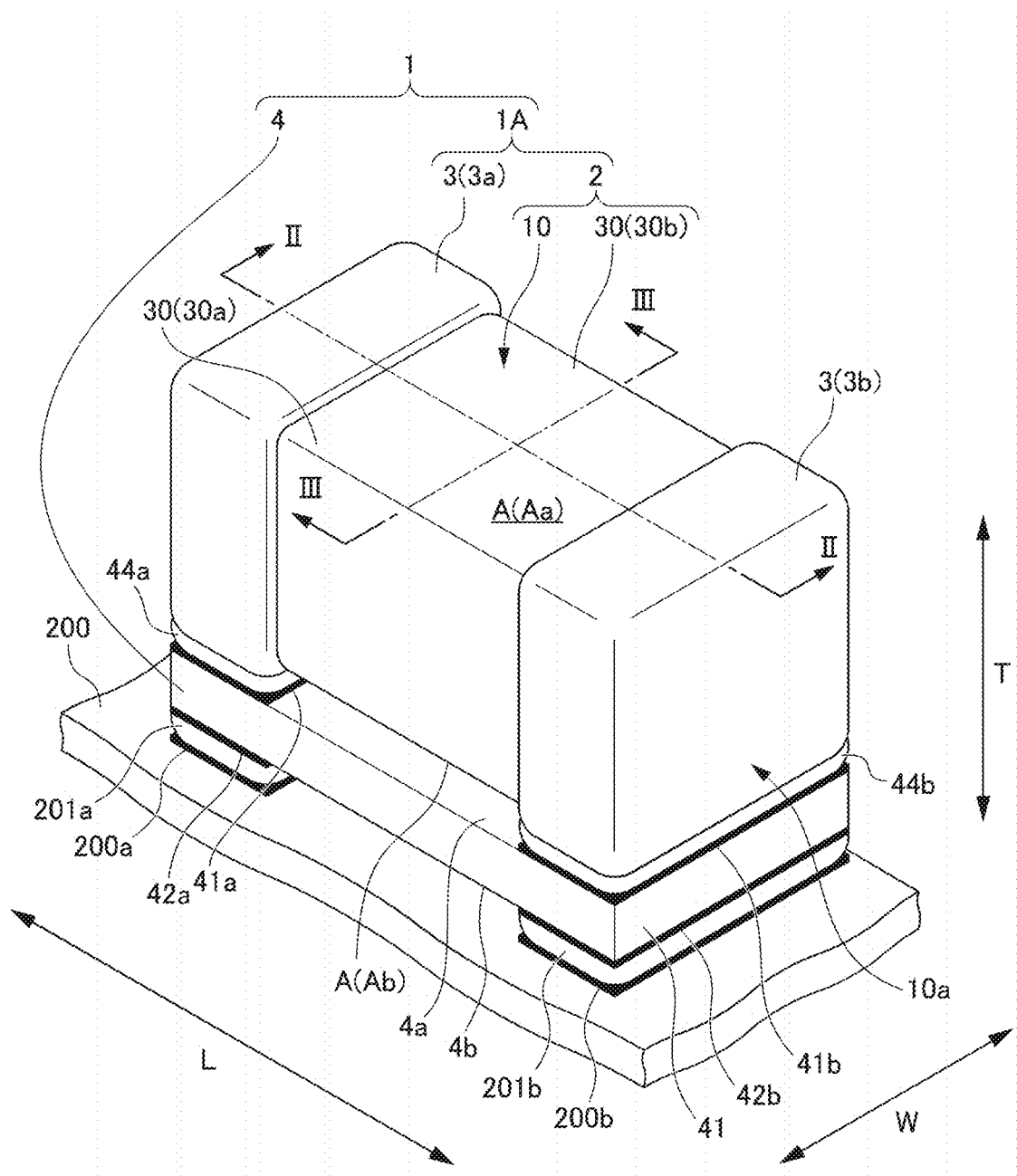
FIG. 1 is a schematic perspective view of a multilayer ceramic capacitor according to Preferred Embodiment 1 of the present invention, which is mounted on a substrate.
Figure 2:
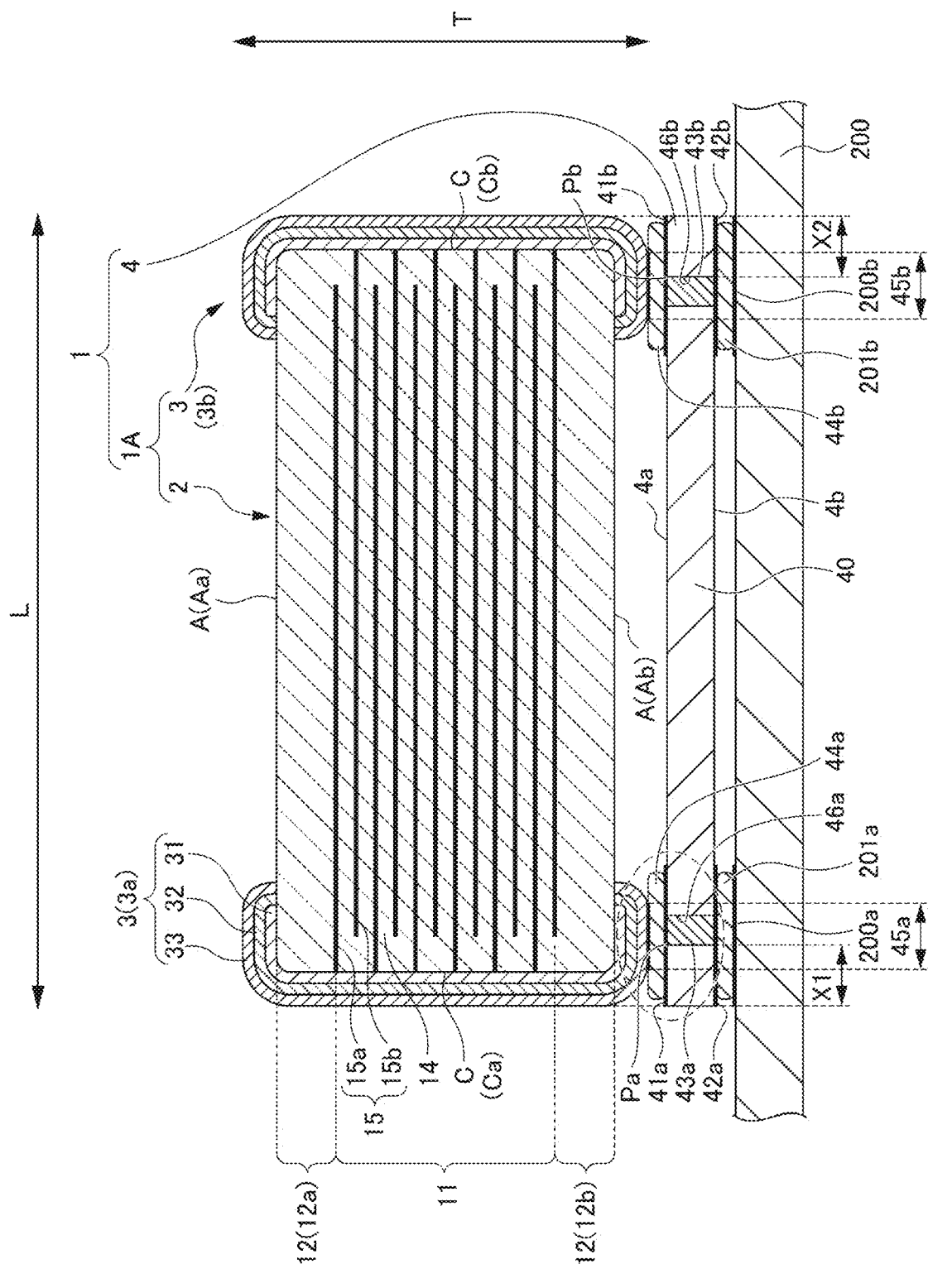
FIG. 2 is a sectional view of the multilayer ceramic capacitor of Preferred Embodiment 1 of the present invention, which is taken along the line II-II in FIG. 1.
Figure 3:
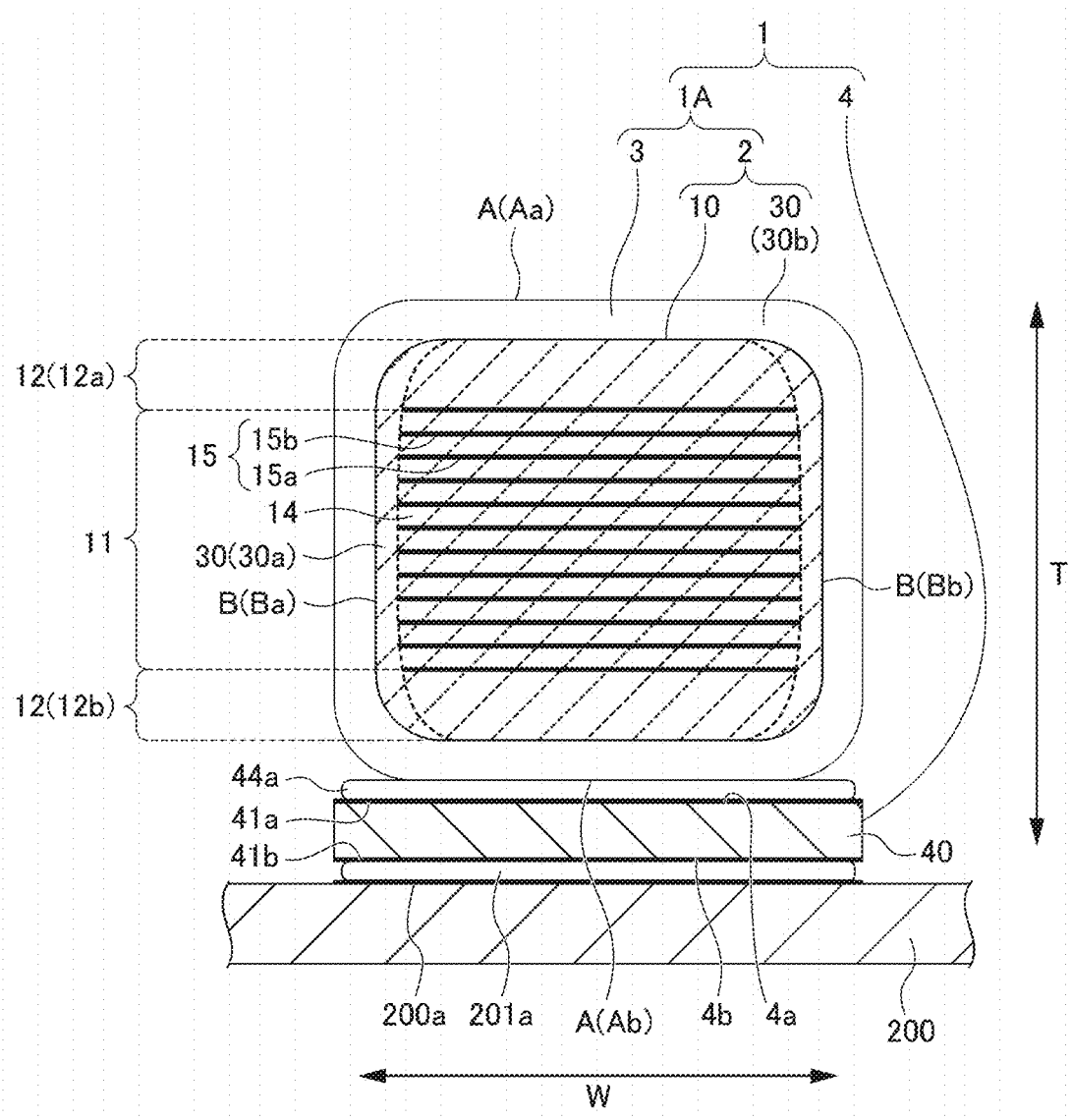
FIG. 3 is a sectional view of the multilayer ceramic capacitor of Preferred Embodiment 1 of the present invention, which is taken along the line in FIG. 1.

FIG. 1 is a schematic perspective view of multilayer ceramic capacitor 1 of Preferred Embodiment 1, which is mounted on a substrate 200. FIG. 2 is a sectional view of multilayer ceramic capacitor 1 of Preferred Embodiment 1, which is taken along the line II-II in FIG. 1. FIG. 3 is a sectional view of multilayer ceramic capacitor 1 of Preferred Embodiment 1, which is taken along the line in FIG. 1.

Multilayer ceramic capacitor 1 has a rectangular or substantially rectangular parallelepiped shape and includes a capacitor body 1A including a stack 2 and a pair of external electrodes 3 provided at the opposite ends of stack 2, and an interposer 4 attached to capacitor body 1A. Stack 2 additionally includes an inner layer portion 11 including multiple pairs of dielectric layers 14 and internal electrode layers 15.

In the description below, the following terms are used to indicate the directions of multilayer ceramic capacitor 1. In multilayer ceramic capacitor 1, a direction in which the pair of external electrodes 3 are provided is a length direction L, a direction in which dielectric layers 14 and internal electrode layers 15 are stacked is a stacking direction T, and a direction intersecting both of length direction L and stacking direction T is a width direction W. In the preferred embodiments, width direction W is orthogonal or substantially orthogonal to both of length direction L and stacking direction T.

Figure 4:
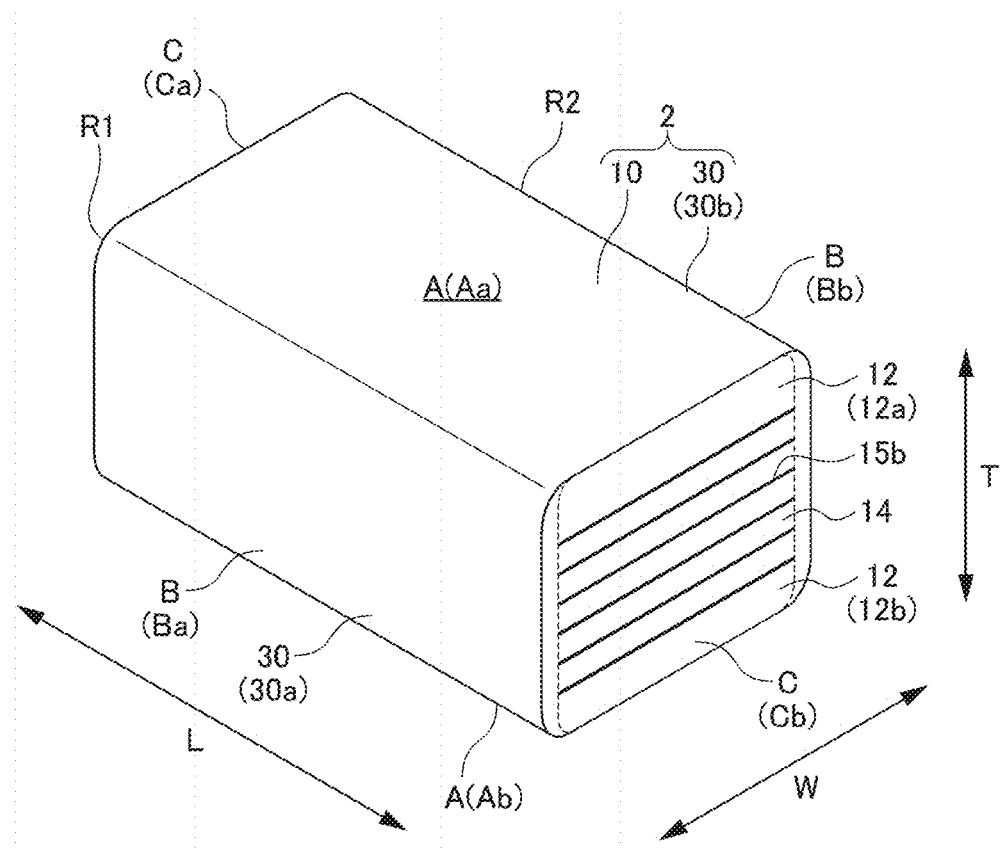
FIG. 4 is a schematic perspective view of a stack of the multilayer ceramic capacitor of Preferred Embodiment 1 of the present invention.
Figure 5:
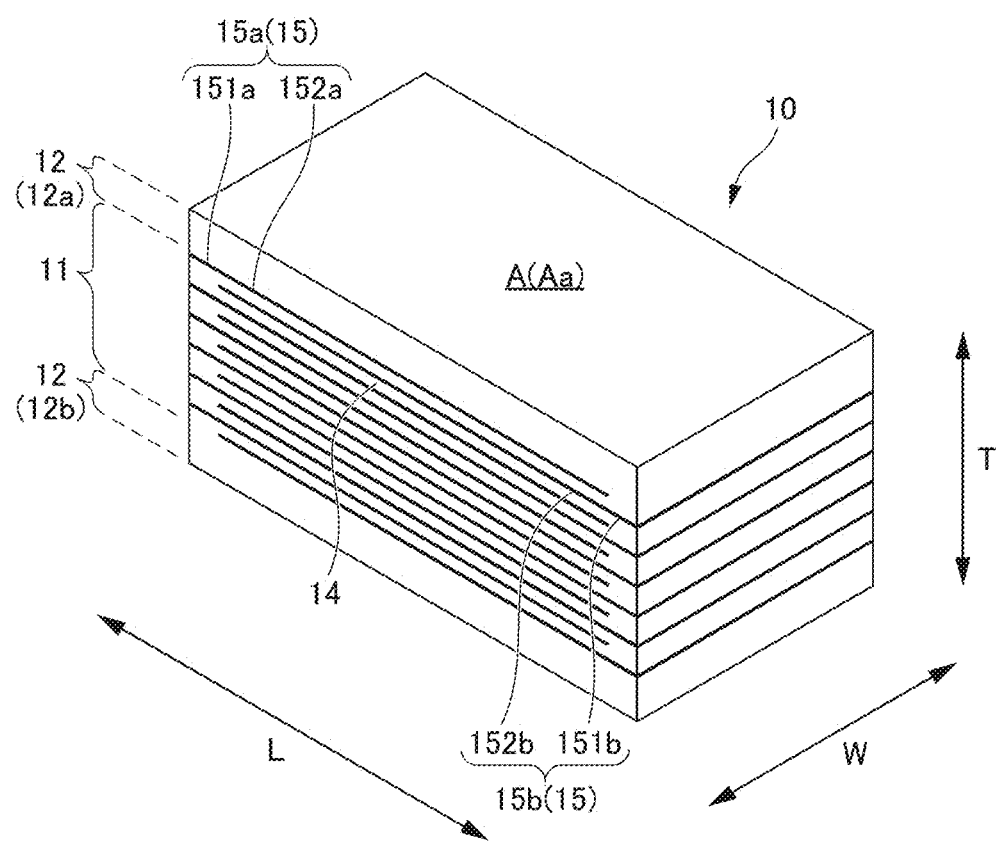
FIG. 5 is a schematic perspective view of a stack body of the multilayer ceramic capacitor of Preferred Embodiment 1 of the present invention.

FIG. 4 is a schematic perspective view of stack 2. Stack 2 includes a stack body 10 and a side gap portion 30. FIG. 5 is a schematic perspective view of stack body 10.

In the description below, among six outer surfaces of stack 2 shown in FIG. 4, a pair of outer surfaces facing each other in stacking direction T are a first main surface Aa and a second main surface Ab, a pair of outer surfaces facing each other in width direction W are a first lateral surface Ba and a second lateral surface Bb, and a pair of outer surfaces facing each other in length direction L are a first end surface Ca and a second end surface Cb.

When it is not necessary to describe first main surface Aa and second main surface Ab distinctively, these surfaces are collectively referred to as a main surface A. When it is not necessary to describe first lateral surface Ba and second lateral surface Bb distinctively, these surfaces are collectively referred to as a lateral surface B. When it is not necessary to describe first end surface Ca and second end surface Cb distinctively, these surfaces are collectively referred to as an end surface C.

Stack 2 preferably has rounded corners R1 and rounded ridges R2. Corner R1 is a portion at which main surface A, lateral surface B, and end surface C meet. Ridge R2 is a portion at which two surfaces of stack 2, namely, main surface A and lateral surface B, main surface A and end surface C, or lateral surface B and end surface C meet.

Recessed and projecting portions or the like may be provided in a portion or all of main surface A, lateral surface B, and end surface C of stack 2. Although the dimensions of stack 2 are not particularly limited, preferably, the dimension in length direction L is not less than about 0.2 mm and not greater than about 10 mm, the dimension in width direction W is not less than about 0.1 mm and not greater than about 10 mm, and the dimension in stacking direction T is not less than about 0.1 mm and not greater than about 5 mm, for example.

Stack body 10 includes inner layer portion 11, an upper outer layer portion 12a, which is disposed on a first main surface Aa side of inner layer portion 11, and a lower outer layer portion 12b disposed on a second main surface Ab side of inner layer portion 11, as shown in FIG. 5.

Inner layer portion 11 includes multiple pairs of dielectric layers 14 and internal electrode layers 15 alternately stacked in stacking direction T.

Dielectric layer 14 preferably has a thickness of not greater than about 0.5 μm, for example. Dielectric layer 14 is preferably made of a ceramic material, for example. The ceramic material may be, for example, dielectric ceramic mainly including $BaTiO_3$. The ceramic material may be ceramic including at least one of accessory components, such as Mn compound, Fe compound, Cr compound, Co compound, and Ni compound, for example, in addition to the above major component. Not less than 15 and not more than 700 dielectric layers 14 are preferably included in stack body 10, including upper outer layer portion 12a and lower outer layer portion 12b.

Internal electrode layers 15 include a plurality of first internal electrode layers 15a and a plurality of second internal electrode layers 15b. First internal electrode layers 15a and second internal electrode layers 15b are alternately disposed. When it is not necessary to describe first internal electrode layer 15a and second internal electrode layer 15b distinctively, these layers are collectively referred to as internal electrode layer 15.

First internal electrode layer 15a includes a first facing portion 152a, which faces second internal electrode layer 15b, and a first lead-out portion 151a, which leads out from first facing portion 152a toward first end surface Ca. First lead-out portion 151a includes an end exposed to first end surface Ca to be electrically connected to a first external electrode 3a, which will be described below.

Second internal electrode layer 15b includes a second facing portion 152b, which faces first internal electrode layer 15a, and a second lead-out portion 151b, which leads out from second facing portion 152b toward second end surface Cb. Second lead-out portion 151b includes an end electrically connected to a second external electrode 3b, which will be described below.

Electric charges are accumulated in first facing portions 152a of first internal electrode layers 15a and second facing portions 152b of second internal electrode layers 15b, so that the characteristics of the capacitor are provided.

Internal electrode layer 15 is preferably made of, for example, a metal material such as Ni, Cu, Ag, Pd, Ag—Pd alloy, or Au. Internal electrode layer 15 preferably has a thickness of not less than about 0.5 μm and not greater than about 2.0 μm, for example. Not less than 15 and not more than 200 internal electrode layers 15, including first internal electrode layers 15a and second internal electrode layers 15b, are preferably provided.

Outer layer portion 12 is preferably made of the same material as that of dielectric layer 14 of inner layer portion 11. The thickness of outer layer portion 12 is, for example, preferably not greater than about 20 μm, and more preferably not greater than about 10 μm.

Side gap portion 30 includes a first side gap portion 30a, which is provided on a first lateral surface Ba side of stack body 10, and a second side gap portion 30b, which is provided on a second lateral surface Bb side of stack body 10.

When it is not necessary to describe first side gap portion 30a and second side gap portion 30b distinctively, these portions are collectively referred to as side gap portion 30.

Side gap portion 30 covers ends of internal electrode layers 15 on width direction W, which are exposed to the opposite lateral surfaces of stack body 10, along the ends. Side gap portion 30 is preferably made of a similar material to that of dielectric layer 14, and additionally includes Mg (magnesium), for example, as a sintering agent. Mg migrates toward internal electrode layers 15 during sintering of side gap portion 30, to thus be segregated to the side of side gap portion 30 which is in contact with internal electrode layers 15. An interface exists between stack body 10 and side gap portion 30.

The thickness of side gap portion 30 is preferably, for example, not greater than about 20 μm, and preferably not greater than about 10 μm.

Although one side gap portion 30 is provided in the present preferred embodiment, the present invention is not limited thereto. Side gap portion 30 may have a two-layer structure including an outer side gap layer located outside and an internal side gap layer located on an internal electrode layer 15 side.

In this case, the outer side gap layer preferably has a higher content of Si than the inner side gap layer. This can improve the strength of side gap portion 30c, leading to an improved deflective strength of multilayer ceramic capacitor 1. Further, side gap portion 30 cracks or chips less easily and can prevent ingress of water, and accordingly, insulation properties of multilayer ceramic capacitor 1 can be improved. Multilayer ceramic capacitor 1 with improved reliability can thus be provided. Also, an interface between the outer side gap layer and the inner side gap layer can mitigate a stress applied to multilayer ceramic capacitor 1.

External electrode 3 includes first external electrode 3a provided on first end surface Ca of stack 2 and second external electrode 3b provided on second end surface Cb of stack 2. When it is not necessary to describe first external electrode 3a and second external electrode 3b distinctively, these electrodes are collectively referred to as external electrode 3. External electrode 3 covers end surface C, as well as a portion of main surface A and a portion of lateral surface B on an end surface C side.

As described above, first lead-out portion 151a of first internal electrode layer 15a includes an end exposed to first end surface Ca to be electrically connected to first external electrode 3a. Second lead-out portion 151b of second internal electrode layer 15b includes an end exposed to second end surface Cb to be electrically connected to second external electrode 3b. As a result, a plurality of capacitor elements are electrically connected in parallel between first external electrode 3a and second external electrode 3b.

As shown in FIG. 2, external electrode 3 has a three-layer structure including a base electrode layer 31, a conductive resin layer 32, which is disposed on base electrode layer 31, and a plating layer 33, which is disposed on conductive resin layer 32.

Although external electrode 3 has the three-layer structure in the present preferred embodiment, the present invention is not limited thereto. External electrode 3 may have, for example, a two-layer structure other than the three-layer structure.

Base electrode layer 31 is formed by, for example, applying and baking a conductive paste including a conductive metal and glass. The conducting metal of base electrode layer 31 may preferably be, for example, Cu, Ni, Ag, Pd, Ag—Pd alloy, or Au.

Conductive resin layer 32 covers base electrode layer 31. Conductive resin layer 32 appropriately includes a thermosetting resin and a metal component. Specific examples of the thermosetting resin include well-known various thermosetting resins, such as epoxy resin, phenol resin, urethane resin, silicone resin, and polyimide resin. The metal component may be, for example, Ag or powdered metal obtained by coating the surface of powdered base metal with Ag.

Plating layer 33 is preferably made of, for example, plating of one metal selected from the group consisting of Cu, Ni, Sn, Ag, Pd, Ag—Pd alloy, Au and/or the like or an alloy including the metal.

As described above, conductive resin layer 32, which includes the thermosetting resin, is more flexible than base electrode layer 31 made of, for example, a plating film or a fired conductive paste. Accordingly, even in case of a physical impact or an impact due to a heat cycle on multilayer ceramic capacitor 1, conductive resin layer 32 defines and functions as a buffer layer to prevent multilayer ceramic capacitor 1 from cracking, and allows a piezoelectric vibration to be absorbed more easily to yield an advantageous effect of preventing or reducing "acoustic sound".

Figure 6A:
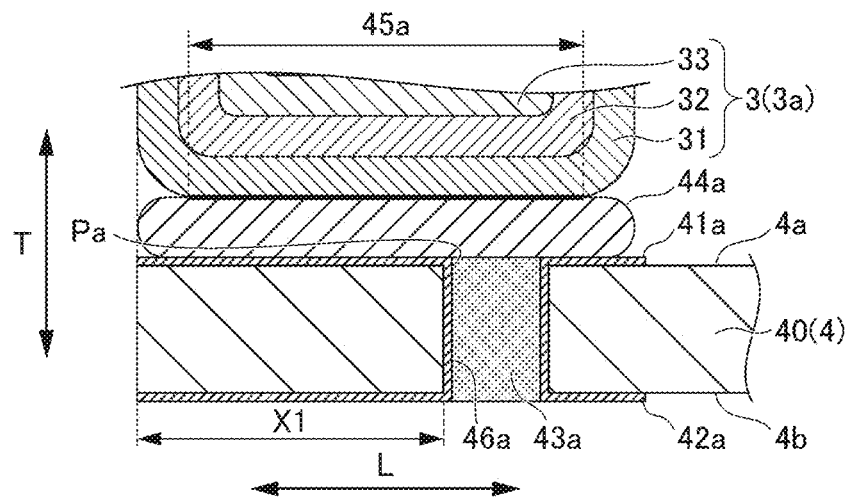
FIG. 6A is an enlarged view of a portion of the multilayer ceramic capacitor, which is circled in FIG. 2 in Preferred Embodiment 1 of the present invention.
Figure 6B:
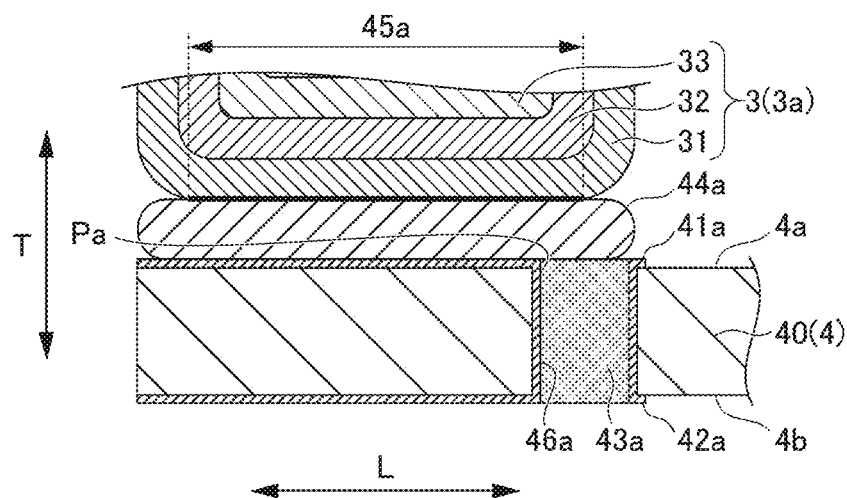
FIGS. 6B and 6C are enlarged views of a portion of a multilayer ceramic capacitor portion circled in FIG. 2 in a modification of Preferred Embodiment 1 of the present invention.
Figure 6C:
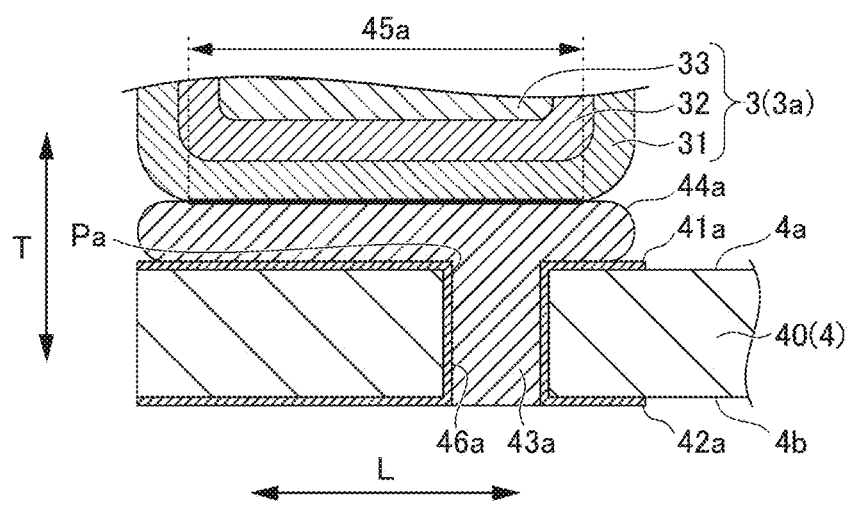

FIG. 6A is a partially enlarged view of a portion of multilayer ceramic capacitor 1, which is circled in FIG. 2 in Preferred Embodiment 1, and FIGS. 6B and 6C are partially enlarged views showing modifications of Preferred Embodiment 1. FIGS. 6A to 6C are enlarged views of the left side of FIG. 2, which is one side in length direction L. Since the configuration of the right side of FIG. 2, which is the other side in length direction L, is the same or substantially the same as that of the left side except for that left and right are reversed, only the configuration of the right side is shown in FIG. 2.

Interposer 4 includes a plate-shaped interposer body 40. Interposer body 40 includes a single plate material mainly made of an insulating resin. Interposer body 40 has a rectangular or substantially rectangular shape and is the same or substantially the same size as that of capacitor body 1A in plan view.

Interposer body 40 is disposed on the second main surface Ab side of capacitor body 1A and includes a first surface 4a, which faces second main surface Ab, and a second surface 4b, which is opposite to first surface 4a. As shown in FIGS. 1, 2, 3, and 6A to 6C, when the first main surface Aa side in stacking direction T is referred to as the upper side and the second main surface Ab side is referred to as the lower side, first surface 4a which is the upper surface is on the second main surface Ab side of the capacitor body, and second surface 4b which is the lower surface is attached to substrate 200 on which multilayer ceramic capacitor 1 is mounted.

On a first external electrode 3a side of interposer body 40 in length direction L, a first joining electrode 41a is provided on a first surface 4a side, a first mounting electrode 42a is provided on a second surface 4b side, and a first pass-through conductive portion 43a, which passes through interposer body 40 in stacking direction T and make first joining electrode 41a and first mounting electrode 42a conductive, is provided. First external electrode 3a and first joining electrode 41a are joined to each other to be conductive with, for example, a first conductive joining material 44a which is, for example, joining solder.

On a second external electrode 3b side of interposer body 40 in length direction L, a second joining electrode 41b is provided on a first surface 4a side, a second mounting electrode 42b is provided on a second surface side, and a second pass-through conductive portion 43b, which passes through interposer body 40 in stacking direction T and makes second joining electrode 41b and second mounting electrode 42b conductive, is provided. Second external electrode 3b and second joining electrode 41b are joined to each other to be conductive with, for example, a second conductive joining material 44b which is, for example, joining solder.

Herein, a first joining region 45a shown in FIGS. 6A to 6C, where first external electrode 3a and first conductive joining material 44a are joined to each other, extends to immediately above an end Pa of first pass-through conductive portion 43a on the first surface 4a side.

A second joining region 45b, which is a region where second external electrode 3b and second conductive joining material 44b are joined to each other, extends to immediately above an end of second pass-through conductive portion 43b on the second surface 4b side.

First joining region 45a is a region where first external electrode 3a and first conductive joining material 44a are in close contact with each other and are electrically connected to each other without any space between first external electrode 3a and first conductive joining material 44a.

Second joining region 45b is a region where second external electrode 3b and second conductive joining material 44b are in close contact with each other and are electrically connected to each other without any space between second external electrode 3b and second conductive joining material 44b.

First pass-through conductive portion 43a is a first metallic film provided on an inside wall of a first through-hole 46a passing through interposer body 40 in stacking direction T, and in the present preferred embodiment, the first metallic film covers the entire or substantially the entire inside wall of first through-hole 46a.

Second pass-through conductive portion 43b is a second metallic film provided on an inside wall of a second through-hole 46b passing through interposer body 40 in stacking direction T, and in the present preferred embodiment, the second metallic film covers the entire or substantially the entire inside wall of second through-hole 46b.

In Preferred Embodiment 1, first joining region 45a, which is a region where first external electrode 3a and first conductive joining material 44a are joined to each other, extends to immediately above end Pa, on the first external electrode 3a side, of the upper end of first pass-through conductive portion 43a, and further, extends over the entire or substantially the entire region immediately above first through-hole 46a beyond first through-hole 46a.

Second joining region 45b, which is a region where second external electrode 3b and second conductive joining material 44b are joined to each other, extends to immediately above end Pb, on the second external electrode 3b side, of the upper end of second pass-through conductive portion 43b, and further, extends over the entire or substantially the entire region immediately above second through-hole 46b beyond second through-hole 46b.

However, the present invention is not limited to the above configuration. As shown in FIG. 6B, first joining region 45a may cover only a portion of the region immediately above first through-hole 46a, not the entire or substantially the entire region. Second joining region 45b may cover only a portion of the region immediately above second through-hole 46b, not the entire or substantially the entire region.

In Preferred Embodiment 1, as shown in FIG. 6A, first conductive joining material 44a, which is joining solder, does not flow into first through-hole 46a, and the first metallic film provided on the inside wall of first through-hole 46a defines and functions as first pass-through conductive portion 43a.

Second conductive joining material 44b, which is joining solder, does not flow into second through-hole 46b, and the second metallic film provided on the inside wall of second through-hole 46b defines and functions as second pass-through conductive portion 43b.

However, the present invention is not limited to the above configuration. As shown in FIG. 6C, first conductive joining material 44a, which is joining solder, may flow into first through-hole 46a, and the first metallic film provided on the inside wall of first through-hole 46a and first conductive joining material 44a which has flowed in may define and function as first pass-through conductive portion 43a.

Second conductive joining material 44b, which is solder, may flow into second through-hole 46b, and the second metallic film provided on the inside wall of second through-hole 46b and the solder which has flowed in may define and function as second pass-through conductive portion 43b.

Preferably, a distance x1 in length direction L from the outer surface of first external electrode 3a on a first end surface Ca side to the inside wall of first through-hole 46a is not greater than about 0.15 mm, and a distance x2 in length direction L from the outer surface of second external electrode 3b on a second end surface Cb side to the inside wall of second through-hole 46b is not greater than about 0.15 mm, for example.

Stacking direction T of internal electrode layers 15 disposed in stack 2 is perpendicular or substantially perpendicular to first surface 4a of interposer 4.

Method of Manufacturing Multilayer Ceramic Capacitor

Figure 7:
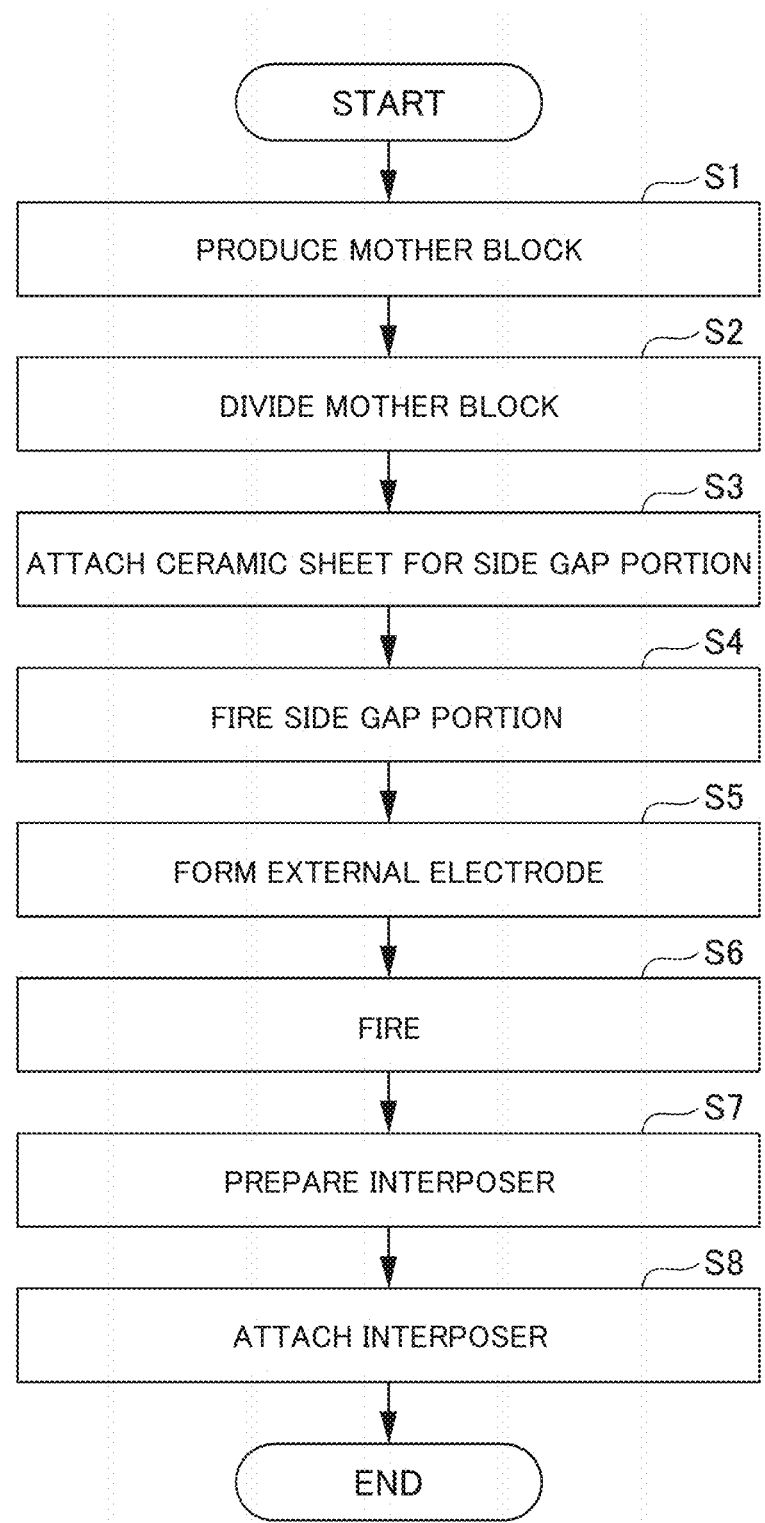
FIG. 7 is a flowchart illustrating a method of manufacturing a multilayer ceramic capacitor according to a preferred embodiment of the present invention.
Figure 8:
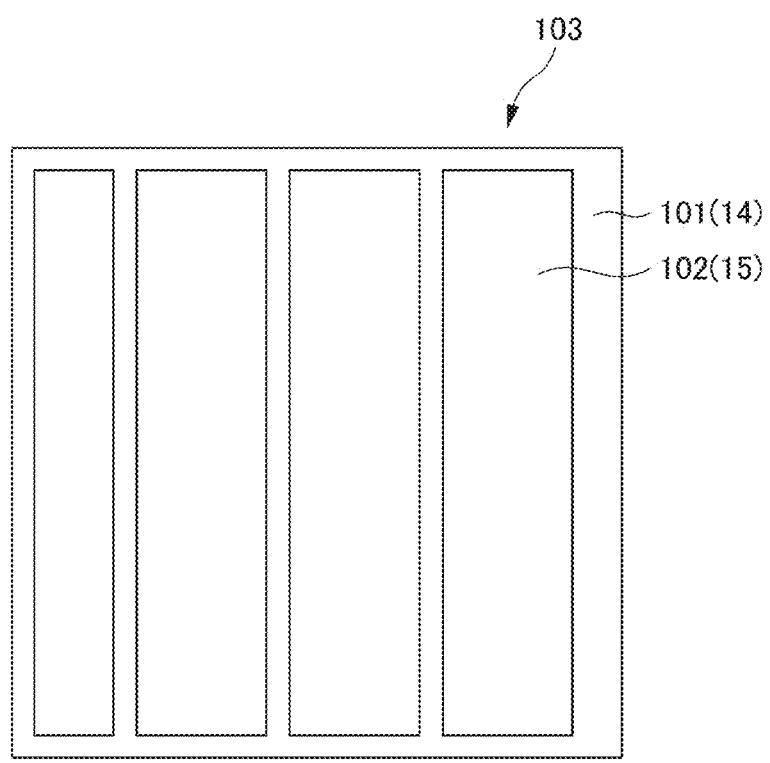
FIG. 8 is a schematic plan view of a raw material sheet.
Figure 9:
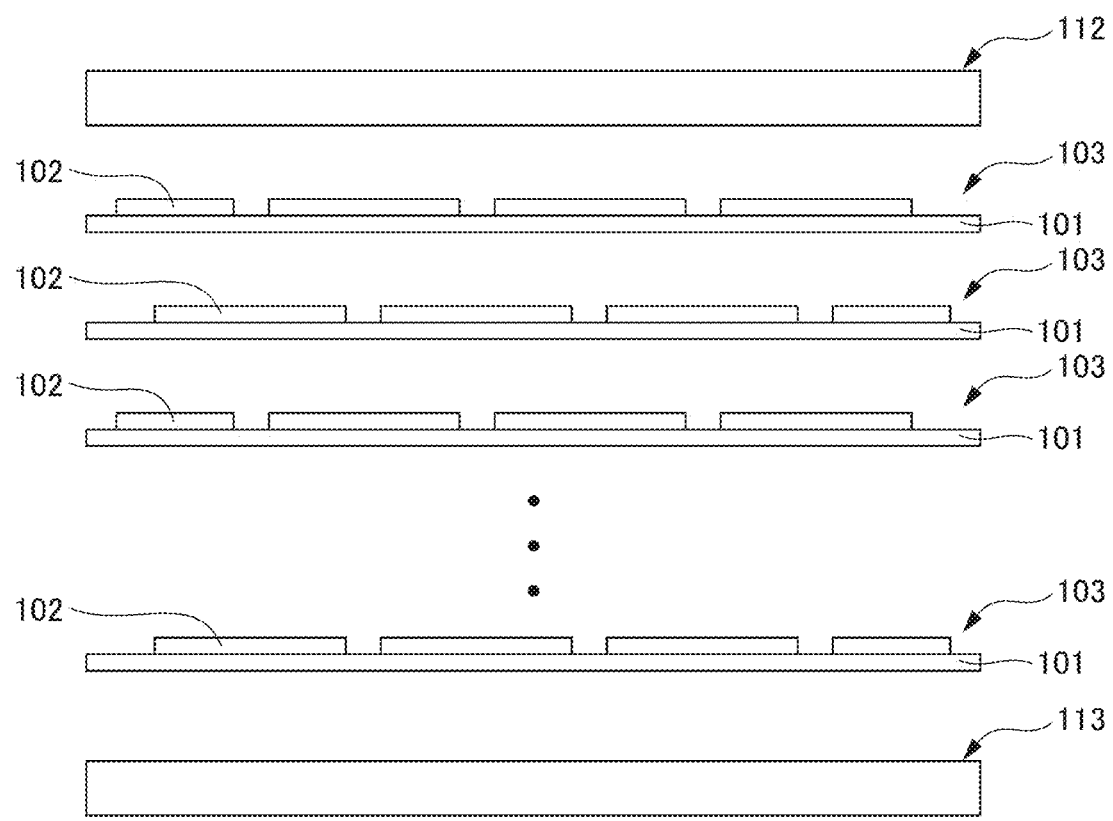
FIG. 9 is a schematic view of raw material sheets which are stacked.
Figure 10:
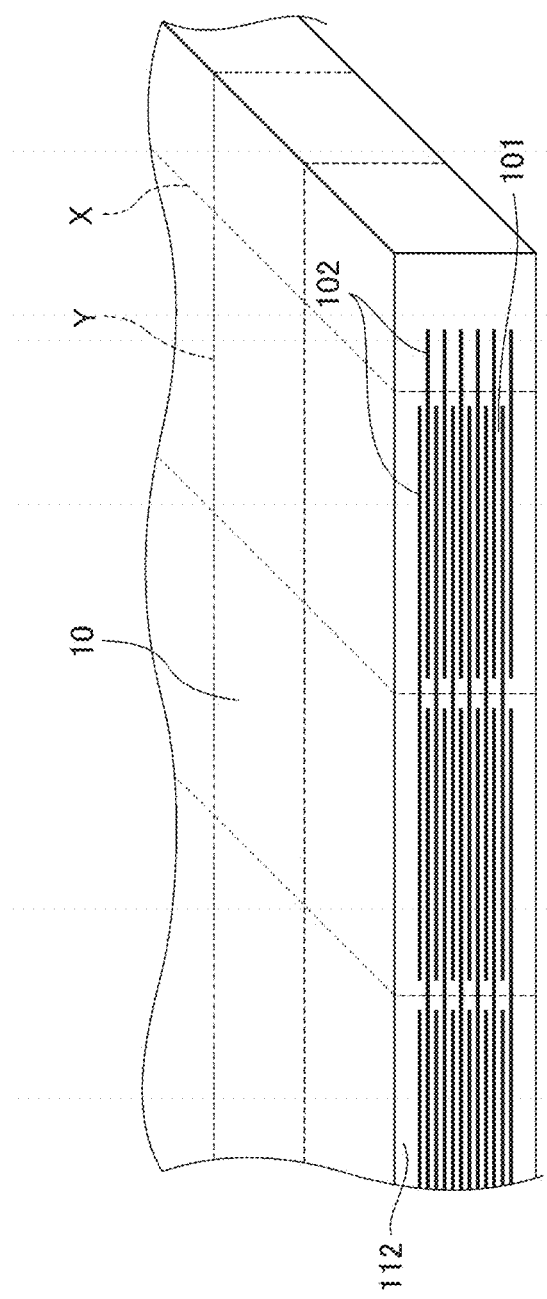
FIG. 10 is a schematic perspective view of a mother block.

FIG. 7 is a flowchart illustrating a non-limiting example of a method of manufacturing multilayer ceramic capacitor 1. FIG. 8 is a schematic plan view of a raw material sheet 103. FIG. 9 is a schematic view of raw material sheets 103 which are stacked. FIG. 10 is a schematic perspective view of a mother block 110.

Step S1 of Producing Mother Block

First, a ceramic slurry including powdered ceramic, a binder, and a solvent is prepared. The ceramic slurry is shaped into a sheet on a carrier film using, for example, a die coater, a gravure coater, a microgravure coater, or the like, to thereby produce a stack ceramic green sheet 101.

Subsequently, a conductive paste is printed on stack ceramic green sheet 101 using, for example, screen printing, inkjet printing, gravure printing, or the like in a belt-shaped pattern, to thus form a conductive pattern 102.

As shown in FIG. 8, raw material sheet 103 is thus prepared, in which conductive pattern 102 that defines and functions as internal electrode layers 15 is printed on a surface of stack ceramic green sheet 101 that defines and functions as dielectric layer 14.

Subsequently, as shown in FIG. 9, raw material sheets 103 are stacked. Specifically, raw material sheets 103 are stacked in layers such that belt-shaped conductive patterns 102 extend in the same direction and belt-shaped conductive patterns 102 are offset by a half pitch in the width direction between adjacent raw material sheets 103. Further, a ceramic green sheet for upper outer layer portion 112, which defines and functions as upper outer layer portion 12a, is stacked on one side of stacked raw material sheets 103, and a ceramic green sheet for lower outer layer portion 113, which defines and functions as lower outer layer portion 12b, is stacked on the other side.

Subsequently, ceramic green sheet for upper outer layer portion 112, stacked raw material sheets 103, and ceramic green sheet for lower outer layer portion 113 are thermo-compression-bonded, to thus form mother block 110 shown in FIG. 10.

Step S2 of Dividing Mother Block

Subsequently, mother block 110 is divided along cutting lines X corresponding to dimensions of stack body 10 and cutting lines Y intersecting cutting lines X, as shown in FIG. 10. Consequently, stack bodies 10 shown in FIG. 5 are manufactured. In the present preferred embodiment, cutting line Y is orthogonal or substantially orthogonal to cutting line X.

Step S3 of Attaching Ceramic Green Sheet for Side Gap Portion

Subsequently, a ceramic slurry is produced that includes dielectric powder similar to that of stack ceramic green sheet 101 and additionally includes, for example, Mg as a sintering agent. Subsequently, the ceramic slurry is applied onto a resin film and dried, thereby producing a ceramic green sheet for side gap portion.

Then, the ceramic green sheets for side gap portion are attached to lateral portions of stack body 10 in which internal electrode layers 15 are exposed, thereby forming a layer that functions as side gap portion 30. In this formation, the ceramic green sheets for side gap portion are pressed against the lateral portions of stack body 10 in which internal electrode layers 15 are exposed.

Step S4 of Firing Side Gap Portion

Stack body 10 with the layer that defines and functions as side gap portion 30 is degreased in a nitrogen atmosphere on prescribed conditions, and is then fired at a prescribed temperature in a mixed atmosphere of nitrogen, hydrogen, and water vapor, resulting in stack 2.

Mg of side gap portion 30 migrates toward internal electrode layers 15 during sintering. After sintering, Mg of side gap portion 30 is then segregated toward internal electrode layers 15. Although dielectric layers 14 and side gap portion 30 are made of the same or substantially the same material, side gap portion 30 is attached to stack body 10 including dielectric layers 14, and accordingly, an interface exists between side gap portion 30 and stack body 10 even after sintering.

Step S5 of Forming External Electrode

Subsequently, base electrode layer 31, conductive resin layer 32, and plating layer 33 are formed sequentially at the opposite ends of stack 2, thus forming external electrode 3.

Firing Step S6

Then, stack 2 with external electrode 3 is heated at a set firing temperature for a prescribed period of time in a nitrogen atmosphere. External electrode 3 is then baked onto stack 2, thus manufacturing capacitor body 1A.

Step S7 of Preparing Interposer

In a rectangular or substantially rectangular plate material, first through-hole 46a and second through-hole 46b passing through this plate material are formed, thus producing interposer body 40. Subsequently, on one side of interposer body 40 in length direction L, first joining electrode 41a is formed on the first surface 4a side, first mounting electrode 42a is formed on the second surface 4b side, and the first metallic film that defines and functions as first pass-through conductive portion 43a is formed on the inside wall of first through-hole 46a. On the other side in length direction L, second joining electrode 41b is formed on the first surface 4a side, second mounting electrode 42b is formed on the second surface 4b side, and the second metallic film that defines and functions as second pass-through conductive portion 43b is formed on the inside wall of second through-hole 46b.

Step S8 of Attaching Interposer

Subsequently, first surface 4a of interposer body 40 is attached to the surface of capacitor body 1A on the second main surface Ab side.

In this attachment, first joining electrode 41a of interposer 4 and first external electrode 3a of capacitor body 1A are connected to each other with first conductive joining material 44a which is, for example, joining solder.

Second joining electrode 41b of interposer 4 and second external electrode 3b of capacitor body 1A are connected to each other with, for example, second conductive joining material 44b which is joining solder.

As a result, multilayer ceramic capacitor 1 shown in FIG. 1 is manufactured.

Subsequently, multilayer ceramic capacitor 1 is mounted on substrate 200.

In this mounting, first mounting electrode 42a of interposer 4 is joined to a first substrate electrode 200a provided on substrate 200 with a first conductive mounting material 201a which is, for example, mounting solder. Second mounting electrode 42b is joined to a second substrate electrode 200b provided on substrate 200 with a second conductive mounting material 201b which is, for example, mounting solder.

Consequently, multilayer ceramic capacitor 1 is mounted on substrate 200. Then, first external electrode 3a, first conductive joining material 44a, first joining electrode 41a, first pass-through conductive portion 43a, first mounting electrode 42a, and first substrate electrode 200a are made conductive. Also, second external electrode 3b, second conductive joining material 44b, second joining electrode 41b, second pass-through conductive portion 43b, second mounting electrode 42b, and second substrate electrode 200b are made conductive.

Advantageous Effects of Preferred Embodiment 1

Preferred Embodiment 1 achieves the following advantageous effects.

In the multilayer ceramic capacitor, the distance from the external electrode to the mounting electrode provided on the substrate side becomes larger with a larger distance between the external electrode and the pass-through conductive portion. This increases an equivalent series inductance (ESL), which may cause a larger loss in high-frequency signals.

However, in multilayer ceramic capacitor 1 of Preferred Embodiment 1, first joining region 45a extends to immediately above end Pa on the first external electrode 3a side, which is the upper end of first pass-through conductive portion 43a, and further, extends over the entire or substantially the entire region immediately above first through-hole 46a beyond first through-hole 46a.

Second joining region 45b, which is the region in which second external electrode 3b and second conductive joining material 44b are joined to each other, extends to immediately above end Pb on the second external electrode 3b side, which is the upper end of second pass-through conductive portion 43b, and further, extends over the entire or substantially the entire region immediately above second through-hole 46b beyond second through-hole 46b.

Thus, when electricity flows from first external electrode 3a to first pass-through conductive portion 43a through first conductive joining material 44a, electricity can flow by the shortest route in first conductive joining material 44a.

Also when electricity flows from second external electrode 3b to second pass-through conductive portion 43b through second conductive joining material 44b, electricity can flow by the shortest route in second conductive joining material 44b.

Preferred Embodiment 1 can thus provide multilayer ceramic capacitor 1 with a reduced ESL.

As distance x1 in length direction L from the outer surface of first external electrode 3a on the first end surface Ca side to the inside wall of first through-hole 46a is preferably set to be not greater than about 0.15 mm, for example, the distance by which electricity flows in first external electrode 3a can be reduced, leading to a further reduced ESL.

Similarly, as the distance in length direction L from the outer surface of second external electrode 3b on the second end surface Cb side to the inside wall of second through-hole 46b is preferably set to be not greater than about 0.15 mm, for example, the distance by which electricity flows in second external electrode 3b can be reduced, leading to a further reduced ESL.

Therefore, multilayer ceramic capacitor 1 capable of reducing the ESL can be provided.

Preferred Embodiment 2

Next, multilayer ceramic capacitor 1 of Preferred Embodiment 2 of the present invention will be described.

Figure 11A:
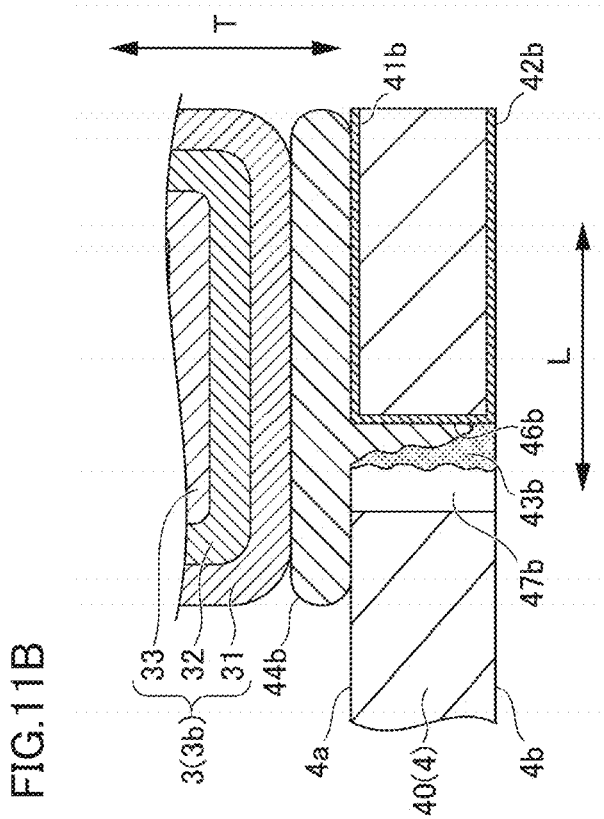
FIG. 11A is a partially enlarged view of a multilayer ceramic capacitor according to Preferred Embodiment 2 of the present invention on one side in a length direction.
Figure 11B:
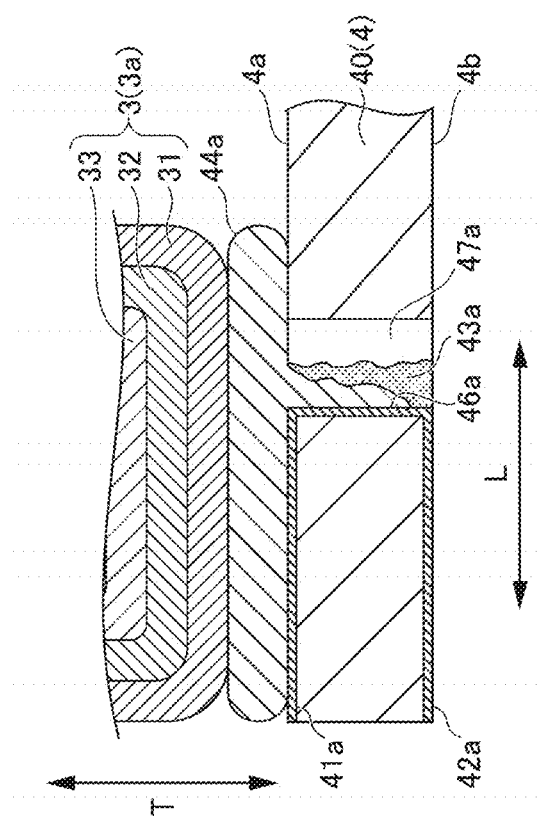
FIG. 11B is a partially enlarged view of the multilayer ceramic capacitor on the other side in the length direction in Preferred Embodiment 2 of the present invention.

FIGS. 11A and 11B are partially enlarged views of multilayer ceramic capacitor 1 in Preferred Embodiment 2, where FIG. 11A is an enlarged view of the left side, which is one side in length direction L shown in FIG. 2, and FIG. 11B is an enlarged view of the right side, which is the other side in length direction L.

The same or similar portions to those of Preferred Embodiment 1 are denoted by the same references, description of which will be omitted.

The features of Preferred Embodiment 2 are as follows.

On the first surface 4a side of the inside wall of first through-hole 46a, a first non-covered portion 47a, which is not covered with the first metallic film defining and functioning as first pass-through conductive portion 43a, is provided. In the following description, the first metallic film is also denoted by reference 43a.

On the first surface 4a side of the inside wall of second through-hole 46b, a second non-covered portion 47b, which is not covered with the second metallic film defining and functioning as second pass-through conductive portion 43b, is provided. In the following description, the second metallic film is also denoted by reference 43b.

On the inside wall of first through-hole 46a, first metallic film 43a is disposed on one side in length direction L on which first external electrode 3a is disposed, and first non-covered portion 47a is disposed on the other side in length direction L.

On the inside wall of second through-hole 46b, second metallic film 43b is disposed on the other side in length direction L on which second external electrode 3b is disposed, and second non-covered portion 47b is disposed on one side in length direction L.

Advantageous Effects of Preferred Embodiment 2

Preferred Embodiment 2 achieves the following advantageous effects.

As described in Preferred Embodiment 1, interposer 4 and capacitor body 1A are joined to each other in step S8 of attaching an interposer by joining first external electrode 3a and first joining electrode 41a to each other with first conductive joining material 44a, which is joining solder, and joining second external electrode 3b and second joining electrode 41b to each other with second conductive joining material 44b, which is joining solder.

Herein, first conductive joining material 44a and second conductive joining material 44b have a higher degree of wettability on first metallic film 43a and second metallic film 43b than on first non-covered portion 47a and second non-covered portion 47b.

Thus, when heated to melt during joining, first conductive joining material 44a flows into first through-hole 46a along first metallic film 43a having a higher degree of wettability. However, first conductive joining material 44a does not flow into first non-covered portion 47a having a lower degree of wettability. First through-hole 46a is thus not completely filled with first conductive joining material 44a.

When heated to melt during joining, second conductive joining material 44b flows into second through-hole 46b along second metallic film 43b having a higher degree of wettability. However, second conductive joining material 44b does not flow into second non-covered portion 47b having a lower degree of wettability. Second through-hole 46b is thus not completely filled with second conductive joining material 44b.

In this manner, a space is provided in each of first through-hole 46a and second through-hole 46b, and such spaces can be provided readily without the step of covering first through-hole 46a and second through-hole 46b.

In mounting multilayer ceramic capacitor 1 on substrate 200, if first through-hole 46a and second through-hole 46b are filled with first conductive joining material 44a and second conductive joining material 44b, respectively, first conductive mounting material 201a and second conductive mounting material 201b which are mounting solder fail to enter first through-hole 46a and second through-hole 46b, respectively, leading to an unstable position of multilayer ceramic capacitor 1 in mounting.

In the present preferred embodiment, however, first through-hole 46a and second through-hole 46b are not completely filled with first conductive joining material 44a and second conductive joining material 44b, respectively. In mounting multilayer ceramic capacitor 1 on substrate 200 with first conductive mounting material 201a and second conductive mounting material 201b, thus, first conductive mounting material 201a and second conductive mounting material 201b can enter first through-hole 46a and second through-hole 46b, respectively, leading to a stable position of multilayer ceramic capacitor 1 in mounting.

As can be seen from the cross-sections shown in FIGS. 11A and 11B, first conductive joining material 44a and second conductive joining material 44b are located over first through-hole 46a and second through-hole 46b, respectively. However, first conductive joining material 44a and second conductive joining material 44b are not located in some portions over first through-hole 46a and second through-hole 46b, other than the portions in the cross-sections shown in FIGS. 11A and 11B. Thus, an air hole (not shown) extending from second surface 4b to first surface 4a is located in each of first through-hole 46a and second through-hole 46b. The air hole is a hole through which air can pass.

In mounting multilayer ceramic capacitor 1 on substrate 200, thus, air between first conductive mounting material 201a and multilayer ceramic capacitor 1 and air between second conductive mounting material 201b and multilayer ceramic capacitor 1 can escape toward first surface 4a of interposer 4 through portions (i.e., air holes) of first through-hole 46a and second through-hole 46b which are not filled with first conductive joining material 44a and second conductive joining material 44b, respectively.

Since air can escape as described above, also, the position of mounting multilayer ceramic capacitor 1 is stable during mounting multilayer ceramic capacitor 1 on substrate 200 with first conductive mounting material 201a and second conductive mounting material 201b.

Contrastingly, if first conductive joining material 44a and second conductive joining material 44b do not flow at all into first through-hole 46a and second through-hole 46b, respectively, during joining capacitor body 1A and interposer 4 to each other, a joining strength between capacitor body 1A and interposer 4 decreases.

In Preferred Embodiment 2, however, first conductive joining material 44a and second conductive joining material 44b partially flow into first through-hole 46a and second through-hole 46b along first metallic film 43a and second metallic film 43b, respectively. Capacitor body 1A and interposer 4 are thus securely joined to each other.

Figure 12A:
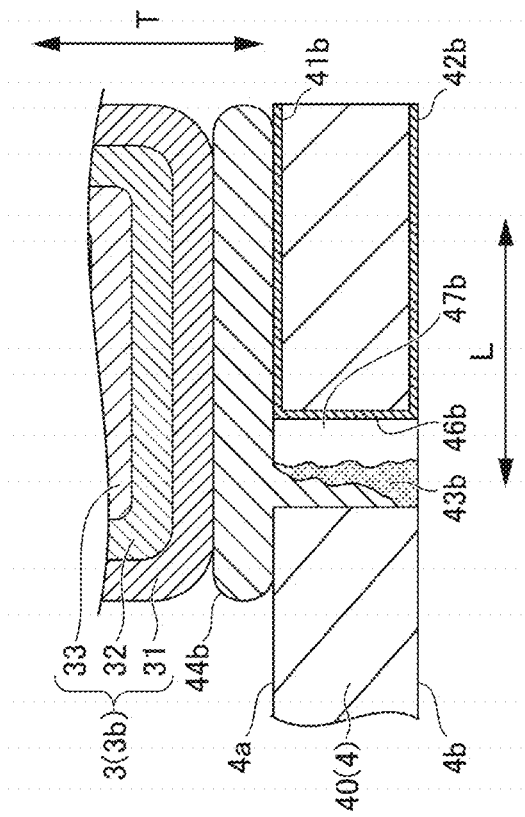
FIG. 12A is a partially enlarged view of a multilayer ceramic capacitor on one side in a length direction in a modification of Preferred Embodiment 2 of the present invention.
Figure 12B:
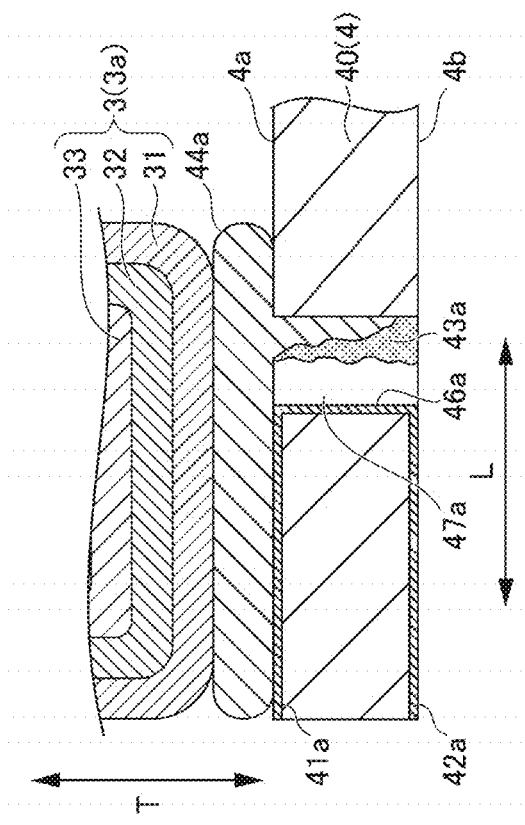
FIG. 12B is a partially enlarged view of the multilayer ceramic capacitor on the other side in the length direction in the modification of Preferred Embodiment 2 of the present invention.
Figure 13:
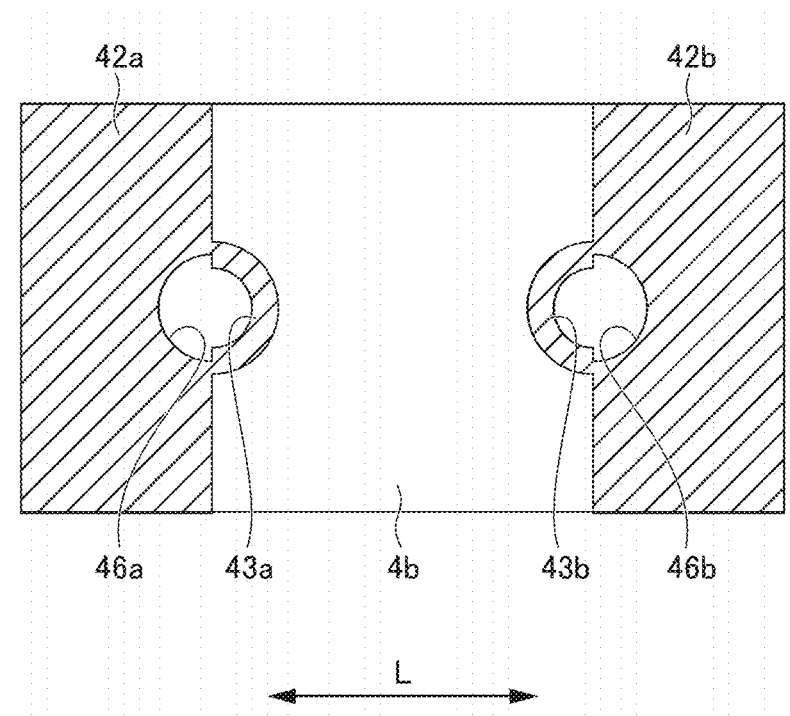
FIG. 13 is a view of the multilayer ceramic capacitor of the modification of Preferred Embodiment 2 of the present invention, which is seen from a second surface side.

FIGS. 12A and 12B are partially enlarged views of a multilayer ceramic capacitor in a modification of Preferred Embodiment 2, where FIG. 12A shows one side in the length direction and FIG. 12B shows the other side in the length direction. FIG. 13 is a view of the multilayer ceramic capacitor of the modification of Preferred Embodiment 2, which is seen from the second surface 4b side.

The modification of multilayer ceramic capacitor 1 of Preferred Embodiment 2 is different from Preferred Embodiment 2 in that on the inside wall of first through-hole 46a, first metallic film 43a is disposed on the other side in length direction L and first non-covered portion 47a is disposed on one side in length direction L, and that on the inside wall of second through-hole 46b, second metallic film 43b is disposed on the other side in length direction L, and second non-covered portion 47b is disposed on one side in length direction L.

In the modification as shown in FIG. 13, first metallic film 43a disposed on the other side of first through-hole 46a is connected to first mounting electrode 42a as first mounting electrode 42a extends to the other side of first through-hole 46a on the second surface 4b side. The same applies to the connection between first metallic film 43a and first joining electrode 41a on the first surface 4a side.

Second metallic film 43b disposed on one side of second through-hole 46b is connected to second mounting electrode 42b as second mounting electrode 42b extends to the other side of second through-hole 46b on the second surface 4b side. The same applies to the connection between second metallic film 43b and second joining electrode 41b on the first surface 4a side. The other points are the same as or similar to those of Preferred Embodiment 2, description of which will be omitted.

The modification of Preferred Embodiment 2 also achieves similar advantageous effects to those of Preferred Embodiment 2.

Preferred Embodiment 3

Next, multilayer ceramic capacitor 1 of Preferred Embodiment 3 of the present invention will be described.

FIGS. 14A and 14B are partially enlarged views of multilayer ceramic capacitor 1 mounted on substrate 200 in Preferred Embodiment 3, where FIG. 14A is an enlarged view of the left side which is one side in length direction L shown in FIG. 2, and FIG. 14B is an enlarged view of the right side which is the other side in length direction L.

The same or similar portions to those of Preferred Embodiment 1 are denoted by the same references, description of which will be omitted.

The features of Preferred Embodiment 3 are as follows.

First mounting electrode 42a includes a first portion 49a, which covers the lower portion of a first interposer end surface 48a of interposer 4 on one side in length direction L, and second mounting electrode 42b includes a second portion 49b, which covers the lower portion of a second interposer end surface 48b of interposer 4 on the other side in length direction L.

Preferably, a length ta of first portion 49a in stacking direction T is less than about half of a thickness of interposer 4, and a length tb of second portion 49b in stacking direction T is less than about half of the thickness of interposer 4.

For example, when interposer 4 has a thickness of not greater than about 1.0 mm, preferably, length ta of first portion 49a in stacking direction T is not greater than about 0.3 mm, and length tb of second portion 49b in stacking direction T is not greater than about 0.3 mm.

When interposer 4 has a thickness of not greater than about 0.5 mm, preferably, length ta of first portion 49a in stacking direction T is not greater than about 0.16 mm, and length tb of second portion 49b in stacking direction T is not greater than about 0.16 mm, for example.

When interposer 4 has a thickness of not greater than about 0.2 mm, preferably, length ta of first portion 49a in stacking direction T is not greater than about 0.06 mm, and length tb of second portion 49b in stacking direction T is not greater than about 0.06 mm, for example.

When interposer 4 has a thickness of not greater than about 0.1 mm, preferably, length ta of first portion 49a in stacking direction T is not greater than about 0.03 mm, and length tb of second portion 49b in stacking direction T is not greater than about 0.03 mm, for example.

Advantageous Effects of Preferred Embodiment 3

Preferred Embodiment 3 achieves the following advantageous effects.

In joining multilayer ceramic capacitor 1 to substrate 200, first conductive mounting material 201a which is, for example, mounting solder is disposed on first substrate electrode 200a provided on substrate 200, and second conductive mounting material 201b which is, for example, mounting solder is disposed on second substrate electrode 200b provided on substrate 200.

Then, as substrate 200 is heated, first conductive mounting material 201a and second conductive mounting material 201b melt.

Multilayer ceramic capacitor 1 is mounted by disposing interposer 4 on substrate 200 with melted first conductive mounting material 201a and melted second conductive mounting material 201b such that, first mounting electrode 42a is located on first conductive mounting material 201a and second mounting electrode 42b is located on second conductive mounting material 201b.

Herein, first mounting electrode 42a includes first portion 49a that covers the lower portion of first interposer end surface 48a. During mounting as shown in FIG. 14A, thus, first conductive mounting material 201a extends up to first portion 49a of first interposer end surface 48a.

Second mounting electrode 42b includes second portion 49b that covers the lower portion of second interposer end surface 48b. During mounting as shown in FIG. 14B, thus, second conductive mounting material 201b extends up to second portion 49b of second interposer end surface 48b.

In interposer 4, thus, first interposer end surface 48a and second interposer end surface 48b that are opposite end surfaces in length direction L are pulled from the opposite ends by a surface tension of first conductive mounting material 201a and a surface tension of second conductive mounting material 201b. Interposer 4, that is, multilayer ceramic capacitor 1, is thus aligned in length direction L, leading to a stable position of multilayer ceramic capacitor 1 during mounting.

Preferred Embodiment 4

Next, multilayer ceramic capacitor 1 of Preferred Embodiment 4 of the present invention will be described.

FIGS. 15A and 15B are partially enlarged views of multilayer ceramic capacitor 1 in Preferred Embodiment 4, where FIG. 15A is an enlarged view of the left side which is one side in length direction L shown in FIG. 2, and FIG. 15B is an enlarged view of the right side which is the other side in length direction L.

The same or similar portions of Preferred Embodiment 3 to those of Preferred Embodiment 1 are denoted by the same references, description of which will be omitted.

Features of Preferred Embodiment 4 are as follows.

First joining electrode 41a includes a first portion 50a that covers the upper portion of first interposer end surface 48a of an interposer 4 substrate on one side in length direction L, and second joining electrode 41b includes a second portion 50b that covers the upper portion of second interposer end surface 48b of the interposer 4 substrate on the other side in length direction L.

Preferably, a length s1 of first portion 50a in stacking direction T is less than about half of a thickness of the interposer 4 substrate, and a length s2 of second portion 50b in stacking direction T is less than a half of the thickness of the interposer 4 substrate in the thickness direction.

For example, when the interposer 4 substrate has a thickness of not greater than about 1.0 mm, preferably, length s1 of first portion 50a in stacking direction T is not greater than about 0.3 mm, and length s2 of second portion 50b in stacking direction T is not greater than about 0.3 mm.

When the interposer 4 substrate has a thickness of not greater than about 0.5 mm, preferably, length s1 of first portion 50a in stacking direction T is not greater than about 0.16 mm, and length s2 of second portion 50b in stacking direction T is not greater than about 0.16 mm, for example.

When the interposer 4 substrate has a thickness of not greater than about 0.2 mm, preferably, length s1 of first portion 50a in stacking direction T is not greater than about 0.06 mm, and length s2 of second portion 50b in stacking direction T is not greater than about 0.06 mm, for example.

When the interposer 4 substrate has a thickness of not greater than about 0.1 mm, preferably, length s1 of first portion 50a in stacking direction T is not greater than about 0.03 mm, and length s2 of second portion 50b in stacking direction T is not greater than about 0.03 mm, for example.

Advantageous Effects of Preferred Embodiment 4

Preferred Embodiment 4 achieves the following advantageous effects.

In joining interposer 4 to capacitor body 1A, first conductive joining material 44a which is, for example, joining solder is disposed on first joining electrode 41a provided on interposer 4, and second conductive joining material 44b which is, for example, joining solder is disposed on second joining electrode 41b provided on interposer 4.

Then, as interposer 4 is heated, first conductive joining material 44a and second conductive joining material 44b melt.

Capacitor body 1A is disposed on and accordingly joined to interposer 4 with melted first conductive joining material 44a and melted second conductive joining material 44b such that first external electrode 3a is located on first conductive joining material 44a and second external electrode 3b is located on second conductive joining material 44b.

Herein, first joining electrode 41a includes first portion 50a that covers the upper portion of first interposer end surface 48a. During joining as shown in FIG. 15A, thus, first conductive joining material 44a extends up to first portion 50a of first interposer end surface 48.

Second joining electrode 41b includes second portion 50b that covers the upper portion of second interposer end surface 48b. During joining as shown in FIG. 15B, thus, second conductive joining material 44b extends up to second portion 50b of second interposer end surface 48b.

In interposer 4, thus, first interposer end surface 48a and second interposer end surface 48b that are opposite end surfaces in length direction L are pulled from the opposite ends by a surface tension of first conductive joining material 44a and a surface tension of second conductive joining material 44b. Interposer 4 is thus aligned in length direction L, leading to a stable position of interposer 4 relative to capacitor body 1A.

When first joining electrode 41a does not extend to the lower portion of first interposer end surface 48a, first conductive mounting material 201a does not extend upward along first interposer end surface 48a in mounting multilayer ceramic capacitor 1 on substrate 200. Accordingly, a fillet, which is a bulge, of first conductive mounting material 201a occurs less easily.

Similarly, when second joining electrode 41b does not extend to the lower portion of second interposer end surface 48b, second conductive mounting material 201b does not extend upward along second interposer end surface 48b in mounting multilayer ceramic capacitor 1 on substrate 200. Accordingly, a fillet, which is a bulge, of second conductive mounting material 201b occurs less easily.

Preferred Embodiment 5

Next, multilayer ceramic capacitor 1 of Preferred Embodiment 5 of the present invention will be described.

FIGS. 16A and 16B are partially enlarged views of multilayer ceramic capacitor 1 in Preferred Embodiment 5, which are similar to those of FIGS. 6A to 6C, where FIG. 16A is an enlarged view of the left side which is one side in length direction L shown in FIG. 2, and FIG. 16B is an enlarged view of the right side which is the other side in length direction L.

The same or similar portions to those of Preferred Embodiment 1 are denoted by the same references, description of which will be omitted.

Features of Preferred Embodiment 5 are as follows.

The inside wall of first through-hole 46a is covered with first metallic film 43a, and the first surface 4a side of first through-hole 46a is filled with first conductive joining material 44a which is, for example, joining solder. First conductive joining material 44a is recessed at a central portion thereof in, for example, a cone shape as first through-hole 46a is seen from second surface 4b toward first surface 4a.

The inside wall of second through-hole 46b is covered with second metallic film 43b, and the first surface 4a side of second through-hole 46b is filled with second conductive joining material 44b which is, for example, joining solder. Second conductive joining material 44b is recessed at a central portion thereof in, for example, a cone shape as second through-hole 46b is seen from second surface 4b toward first surface 4a.

Preferably, an end edge 51a, on the inside wall of first through-hole 46a, of first conductive joining material 44a which has flowed into first through-hole 46a is located on the side closer to first surface 4a relative to a position with a half of the thickness of interposer 4. More, preferably, end edge 51a is located on the side closer to first surface 4a relative to a position with one third of the thickness of interposer 4.

Preferably, an end edge 51b, on the inside wall of second through-hole 46b, of second conductive joining material 44b which has flowed into second through-hole 46b, is located on the side closer to first surface 4a relative to a position with a half of the thickness of interposer 4. More preferably, end edge 51b is located on the side closer to first surface 4a relative to a position with one third of the thickness of interposer 4.

The thickness of interposer 4 is preferably, for example, not greater than about 1.0 mm, not greater than about 0.5 mm, not greater than about 0.2 mm, or not greater than about 0.1 mm.

In Preferred Embodiment 5, for example, step S8 of attaching an interposer is performed as follows such that first conductive joining material 44a and second conductive joining material 44b are recessed at central portions thereof as seen from second surface 4b toward first surface 4a. However, the present invention is not limited thereto and may use any other suitable method.

First, first conductive joining material 44a and second conductive joining material 44b which are, for example, joining solder, are disposed on first joining electrode 41a and second joining electrode 41b, respectively. On this occasion, first conductive joining material 44a and second conductive joining material 44b are disposed over first through-hole 46a and second through-hole 46b in a larger amount than over other portions.

Preferably, the wettability of first conductive joining material 44a on first metallic film 43a and the wettability of second conductive joining material 44b on second metallic film 43b are improved by preliminarily forming a thinner soldering film on the surface of each of first metallic film 43a on the inside wall of first through-hole 46a and second metallic film 43b on the inside wall of second through-hole 46b or by performing any other surface treatment.

Then, interposer 4 is heated to melt first conductive joining material 44a and second conductive joining material 44b.

On this occasion, since first conductive joining material 44a and second conductive joining material 44b are disposed in a larger amount over first through-hole 46a and second through-hole 46b than over other portions, first conductive joining material 44a and second conductive joining material 44b flow downwardly toward first mounting electrode 42a and second mounting electrode 42b along first metallic film 43a and second metallic film 43b, respectively.

A heating time and a heating temperature are adjusted such that first conductive joining material 44a and second conductive joining material 44b flow out downwardly toward first mounting electrode 42a and second mounting electrode 42b and do not fill first through-hole 46a and second through-hole 46b completely, thus allowing first conductive joining material 44a and second conductive joining material 44b to be recessed at the central portions thereof, respectively, as seen from second surface 4b toward first surface 4a.

Capacitor body 1A is disposed on and accordingly joined to interposer 4 with melted first conductive joining material 44a and melted second conductive joining material 44b such that first external electrode 3a is located on first conductive joining material 44a and second external electrode 3b is located on second conductive joining material 44b.

As a result, first conductive joining material 44a and second conductive joining material 44b are formed so as to be recessed at central portions thereof as seen from second surface 4b toward first surface 4a.

Advantageous Effects of Preferred Embodiment 5

In Preferred Embodiment 5, a space is provided in each of first through-hole 46a and second through-hole 46b, and such spaces can be provided readily without, for example, the step of covering first through-hole 46a and second through-hole 46b.

In mounting multilayer ceramic capacitor 1 on substrate 200, first mounting electrode 42a of interposer 4 is joined to first substrate electrode 200a provided on substrate 200 with first conductive mounting material 201a which is, for example, joining solder. Second mounting electrode 42b is joined to second substrate electrode 200b provided on substrate 200 with second conductive mounting material 201b which is, for example, mounting solder.

In Preferred Embodiment 5, first conductive joining material 44a is located over first through-hole 46a, and first conductive joining material 44a is recessed at a central portion thereof in, for example, a cone shape as first through-hole 46a is seen from second surface 4b toward first surface 4a.

Second conductive joining material 44b is located over second through-hole 46b, and second conductive joining material 44b is recessed at a central portion thereof in, for example, a cone shape as second through-hole 46b is seen from second surface 4b toward first surface 4a.

In other words, first through-hole 46a and second through-hole 46b are not completely filled with first conductive joining material 44a and second conductive joining material 44b, respectively, and a space is provided in each through hole. In mounting multilayer ceramic capacitor 1 on substrate 200 with first conductive mounting material 201a and second conductive mounting material 201b, first conductive mounting material 201a and second conductive mounting material 201b can enter the spaces of first through-hole 46a and second through-hole 46b, respectively, leading to a stable position of multilayer ceramic capacitor 1 in mounting.

The surface of first conductive joining material 44a on the second surface 4b side in first through-hole 46a is recessed at a central portion thereof, and accordingly, has a larger area than in the case where the surface is flat. The surface of second conductive joining material 44b on the second surface 4b side in second through-hole 46b is recessed at a central portion thereof, and accordingly, has a larger area than in the case where the surface is flat.

Thus, an area of contact between first conductive mounting material 201a and first conductive joining material 44a and an area of contact between second conductive mounting material 201b and second conductive joining material 44b are large, leading to an increased joining strength between first conductive mounting material 201a and first conductive joining material 44a and an increased joining strength between second conductive mounting material 201b and second conductive joining material 44b.

Although Preferred Embodiment 1 to Embodiment 5 of the present invention have been described above, the present invention is not limited to these preferred embodiments and can be varied within the scope of the present invention.

For example, interposer 4 has a length the same or substantially the same in width direction W as the length of external electrode 3 in width direction W in the preferred embodiment as shown in FIG. 3, but the present invention is not limited thereto. Specifically, the length of interposer 4 in width direction W may be smaller than the length of external electrode 3 in width direction W. For example, the length of interposer 4 in width direction W may be smaller by, for example, about 10 μm than the length of the widest portion of internal electrode layer 15 in width direction W.

Although the preferred embodiments have described the manner in which one interposer 4 is attached to capacitor body 1A, the present invention is not limited thereto. For example, interposer 4 may have two-piece structure which includes a first interposer portion including a joining electrode connected to first external electrode 3a and a second interposer portion spaced away from the first interposer portion and including a joining electrode connected to second external electrode 3b.

Although Preferred Embodiment 1 to Preferred Embodiment 5 of the present invention have been described separately, some of these preferred embodiments may be combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
 a capacitor body; and
 an interposer; wherein
 the capacitor body includes:
  a stack including:
   dielectric layers and internal electrode layers alternately stacked;
   a first main surface on a first side in a stacking direction and a second main surface on a second side in the stacking direction; and
   a first end surface on a first side in a length direction intersecting the stacking direction and a second end surface on a second side in the length direction;

a first external electrode disposed on the first end surface of the stack and extending from the first end surface to a portion of the first main surface and a portion of the second main surface;

a second external electrode disposed on the second end surface of the stack and extending from the second end surface to a portion of the first main surface and a portion of the second main surface;

the interposer is disposed on a second main surface side in the capacitor body, and includes:
a first surface facing the second main surface; and
a second surface opposite to the first surface;

the interposer includes, on a first external electrode side in the length direction, a first joining electrode on a first surface side, a first mounting electrode on a second surface side, and a first through-hole passing through the interposer in the stacking direction and in which a first pass-through conductive portion is provided on an inside wall of the first through-hole, the first pass-through conductive portion making the first joining electrode and the first mounting electrode conductive;

a first surface side of the first through-hole is at least partially filled with a first conductive joining material, and the first conductive joining material is recessed at a central portion thereof as the first through-hole is seen from the second surface toward the first surface;

the interposer includes, on a second external electrode side in the length direction, a second joining electrode on the first surface side, a second mounting electrode on the second surface side, and a second through-hole passing through the interposer in the stacking direction and in which a second pass-through conductive portion is provided on an inside wall of the second through-hole, the second pass-through conductive portion making the second joining electrode and the second mounting electrode conductive; and a first surface side of the second through-hole is at least partially filled with a second conductive joining material, and the second conductive joining material is recessed at a central portion thereof as the second through-hole is seen from the second surface toward the first surface.

2. The multilayer ceramic capacitor according to claim 1, wherein the inside walls of the first through-hole and the second through-hole are each covered with a metallic film.

3. The multilayer ceramic capacitor according to claim 1, wherein
an end edge, on the inside wall of the first through-hole, of the first conductive joining material in the first through-hole is located on a side closer to the first surface relative to a position at a half of a thickness of the interposer; and
an end edge, on the inside wall of the second through-hole, of the second conductive joining material in the second through-hole is located on a side closer to the first surface relative to a position at a half of the thickness of the interposer.

4. The multilayer ceramic capacitor according to claim 1, wherein
an end edge, on the inside wall of the first through-hole, of the first conductive joining material in the first through-hole is located on a side closer to the first surface relative to a position at one third of a thickness of the interposer; and
an end edge, on the inside wall of the second through-hole, of the second conductive joining material in the second through-hole is located on a side closer to the first surface relative to a position at one third of the thickness of the interposer.

5. The multilayer ceramic capacitor according to claim 1, wherein the interposer has a thickness of not greater than about 1.0 mm.

6. The multilayer ceramic capacitor according to claim 1, wherein the interposer has a thickness of not greater than about 0.5 mm.

7. The multilayer ceramic capacitor according to claim 1, wherein the interposer has a thickness of not greater than about 0.2 mm.

8. The multilayer ceramic capacitor according to claim 1, wherein the interposer has a thickness of not greater than about 0.1 mm.

9. The multilayer ceramic capacitor according to claim 1, wherein
a distance in the length direction from an outer surface of the first external electrode on a first end surface side to the inside wall of the first through-hole is not greater than about 0.15 mm; and
a distance in the length direction from an outside wall of the second external electrode on a second end surface side to the inside wall of the second through-hole is not greater than about 0.15 mm.

10. The multilayer ceramic capacitor according to claim 1, wherein the stacking direction of the internal electrode layers disposed in the stack is perpendicular or substantially perpendicular to the first surface of the interposer.

11. The multilayer ceramic capacitor according to claim 1, wherein a dimension of the capacitor body in the length direction L is not less than about 0.2 mm and not greater than about 10 mm, a dimension of the capacitor body in a width direction is not less than about 0.1 mm and not greater than about 10 mm, and a dimension of the capacitor body in a stacking direction is not less than about 0.1 mm and not greater than about 5 mm.

12. The multilayer ceramic capacitor according to claim 1, wherein each of the dielectric layers has a thickness of about 0.5 µm.

13. The multilayer ceramic capacitor according to claim 1, wherein each of the dielectric layers includes a dielectric ceramic including $BaTiO_3$ as a main component.

14. The multilayer ceramic capacitor according to claim 13, wherein each of the dielectric layers further includes at least one of a Mn compound, a Fe compound, a Cr compound, a Co compound, or a Ni compound.

15. The multilayer ceramic capacitor according to claim 1, wherein
the internal electrode layers include a plurality of first internal electrode layers and a plurality of second internal electrode layers that are alternately provided;
the plurality of first internal electrode layers extend to the first end surface and are connected to the first external electrode; and
the plurality of second internal electrode layers extend to the second end surface and are connected to the second external electrode.

16. The multilayer ceramic capacitor according to claim 1, wherein each of the internal electrode layers includes at least one of Ni, Cu, Ag, Pd, Ag—Pd alloy, or Au.

17. The multilayer ceramic capacitor according to claim 1, wherein each of the internal electrode layers has a thickness of not less than about 0.5 µm and not greater than about 2.0 µm.

18. The multilayer ceramic capacitor according to claim 1, wherein each of the first and second external electrodes includes a base electrode layer, a conductive resin layer on the base electrode layer, and a plating layer on the conductive resin layer.

19. The multilayer ceramic capacitor according to claim 1, wherein the interposer has a rectangular or substantially rectangular shape and is a same or substantially a same size as that the capacitor body.

20. The multilayer ceramic capacitor according to claim 1, wherein
- on the first surface side of the inside wall of the first through-hole, a first non-covered portion is provided, which is not coated with the first conductive joining material; and
- on the first surface side of the inside wall of second through-hole, a second non-covered portion is provided, which is not coated with the second conductive joining material.

\* \* \* \* \*